US011507872B2

(12) United States Patent
Cao et al.

(10) Patent No.: US 11,507,872 B2
(45) Date of Patent: Nov. 22, 2022

(54) HYBRID QUANTUM-CLASSICAL COMPUTER SYSTEM AND METHOD FOR PERFORMING FUNCTION INVERSION

(71) Applicant: Zapata Computing, Inc., Cambridge, MA (US)

(72) Inventors: Yudong Cao, Cambridge, MA (US); Jonathan P. Olson, Cambridge, MA (US); Eric R. Anschuetz, Cambridge, MA (US)

(73) Assignee: Zapata Computing, Inc., Boston, MA (US)

( * ) Notice: Subject to any disclaimer, the term of this patent is extended or adjusted under 35 U.S.C. 154(b) by 0 days.

(21) Appl. No.: 16/543,478

(22) Filed: Aug. 16, 2019

(65) Prior Publication Data

US 2020/0394547 A1 Dec. 17, 2020

Related U.S. Application Data

(60) Provisional application No. 62/844,281, filed on May 7, 2019, provisional application No. 62/719,464, filed on Aug. 17, 2018.

(51) Int. Cl.
*G06N 10/00* (2022.01)
*G06N 7/08* (2006.01)
*H03K 19/21* (2006.01)

(52) U.S. Cl.
CPC .............. *G06N 10/00* (2019.01); *G06N 7/08* (2013.01); *H03K 19/21* (2013.01)

(58) Field of Classification Search
CPC .................................................. G06N 10/00
See application file for complete search history.

(56) References Cited

U.S. PATENT DOCUMENTS 7,590,607 B2 9/2009 Williams
7,877,333 B2 1/2011 Macready
(Continued)

FOREIGN PATENT DOCUMENTS

CN 106611377 A 5/2017
CN 112789629 A 5/2021
(Continued)

OTHER PUBLICATIONS

Otterbach et al., U.S. Appl. No. 62/597,836 Specification, Provisional for U.S. Appl. No. 16/217,410, now U.S. Pat. No. 10,846,366, Dec. 2017. (Year: 2017).*

(Continued)

*Primary Examiner* — Kamran Afshar
*Assistant Examiner* — Marshall L Werner
(74) *Attorney, Agent, or Firm* — Blueshift IP, LLC; Robert Plotkin

(57) ABSTRACT

A hybrid quantum-classical (HQC) computing system, including a quantum computing component and a classical computing component, computes the inverse of a Boolean function for a given output. The HQC computing system translates a set of constraints into interactions between quantum spins; forms, from the interactions, an Ising Hamiltonian whose ground state encodes a set of states of a specific input value that are consistent with the set of constraints; performs, on the quantum computing component, a quantum optimization algorithm to generate an approximation to the ground state of the Ising Hamiltonian; and measures the approximation to the ground state of the Ising Hamiltonian, on the quantum computing component, to obtain a plurality of input bits which are a satisfying assignment of the set of constraints.

18 Claims, 10 Drawing Sheets

(56) References Cited

U.S. PATENT DOCUMENTS

| | | | |
|---|---|---|---|
| 8,700,689 | B2 | 4/2014 | Macready |
| 8,832,164 | B2 | 9/2014 | Allen |
| 8,832,165 | B2 | 9/2014 | Allen |
| 8,897,449 | B1 | 11/2014 | Broadbent |
| 9,064,067 | B2 | 6/2015 | Wecker |
| 9,218,567 | B2 | 12/2015 | Macready |
| 9,477,796 | B2 | 10/2016 | Garcia-Ramirez |
| 9,836,432 | B2 | 12/2017 | Ronagh |
| 10,242,321 | B2 | 3/2019 | Bocharov |
| 10,275,717 | B2 | 4/2019 | Babbush |
| 10,325,218 | B1 | 6/2019 | Zeng |
| 10,572,816 | B1 | 2/2020 | Vavilov |
| 10,666,462 | B2 | 5/2020 | Shin |
| 10,776,709 | B2 | 9/2020 | Shen |
| 10,846,366 | B1* | 11/2020 | Otterbach ............... G06F 17/17 |
| 10,990,677 | B2 | 4/2021 | Wiebe |
| 11,010,682 | B2 | 5/2021 | Bocharov |
| 11,244,240 | B2 | 2/2022 | Martinis et al. |
| 2005/0167658 | A1 | 8/2005 | Williams |
| 2014/0297247 | A1 | 10/2014 | Troyer et al. |
| 2017/0147303 | A1* | 5/2017 | Amy ........................ G06F 8/44 |
| 2017/0255872 | A1 | 9/2017 | Hamze |
| 2017/0364796 | A1 | 12/2017 | Wiebe |
| 2018/0197102 | A1 | 7/2018 | Mohseni |
| 2019/0164059 | A1 | 5/2019 | Denchev et al. |
| 2019/0164079 | A1 | 5/2019 | Gambetta et al. |
| 2019/0244680 | A1 | 8/2019 | Rolfe et al. |
| 2019/0318053 | A1 | 10/2019 | Low |
| 2019/0378032 | A1 | 12/2019 | Kliuchnikov |
| 2019/0394030 | A1 | 12/2019 | Forbes |
| 2020/0057957 | A1 | 2/2020 | Johnson et al. |
| 2020/0104740 | A1 | 4/2020 | Cao |
| 2020/0118025 | A1 | 4/2020 | Romero et al. |
| 2020/0184278 | A1 | 6/2020 | Zadeh et al. |
| 2020/0202249 | A1 | 6/2020 | Hastings |
| 2020/0226197 | A1 | 7/2020 | Woerner et al. |
| 2020/0257987 | A1 | 8/2020 | McGeoch et al. |
| 2020/0293936 | A1 | 9/2020 | Granade |
| 2020/0320159 | A1 | 10/2020 | Matthews |
| 2020/0327440 | A1 | 10/2020 | Cao |
| 2020/0327441 | A1 | 10/2020 | Cao |
| 2020/0334107 | A1 | 10/2020 | Katabarwa |
| 2020/0349459 | A1 | 11/2020 | Cao |
| 2021/0011748 | A1 | 1/2021 | Lee |
| 2021/0133618 | A1 | 5/2021 | Cao |
| 2021/0255856 | A1 | 8/2021 | Yudong |

FOREIGN PATENT DOCUMENTS

| | | | |
|---|---|---|---|
| EP | 3113084 | A1 | 1/2017 |
| EP | 3837647 | A1 | 6/2021 |
| WO | 2017066695 | A1 | 4/2017 |
| WO | 2017152289 | A1 | 9/2017 |
| WO | 2017156318 | A1 | 9/2017 |
| WO | 2017189052 | A1 | 11/2017 |
| WO | 2018064535 | A1 | 4/2018 |
| WO | 2020037301 | A1 | 2/2020 |
| WO | 2020072661 | A1 | 4/2020 |
| WO | 2020142122 | A2 | 7/2020 |
| WO | 2021092351 | A1 | 5/2021 |
| WO | 2022173497 | A1 | 8/2022 |
| WO | 2022173497 | A9 | 8/2022 |

OTHER PUBLICATIONS

Dash et al., Exact Search Algorithm to Factorize Large Biprimes and a Triprime on IBM Quantum Computer, Jul. 2018. (Year: 2018).*

Farhi et al., "A quantum approximate optimization algorithm," arXiv preprint arXiv:1411.4028, 2014, 16 pages.

Peter W. Shor, "Polynomial-Time Algorithms for Prime Factorization and Discrete Logarithms on a Quantum Computer," SIAM J.Sci.Statist.Comput. 26, 28 pages, (1997) 1484, arXiv:9508027.

Abhinav Kandala et al., "Hardware-efficient Variational Quantum Eigensolver for Small Molecules and Quantum Magnets," Nature 549, 242 (2017), 24 pages, arXiv:1704.05018.

Christopher J. C. Burges, "Factoring as Optimization," Microsoft Research, Microsoft Corporation, Tech. Rep. MSR-TR-2002-83, 19 pages (2002).

Raouf Dridi et al., "Prime Factorization Using Quantum Annealing and Computational Algebraic Geometry," Nature Scientific Reports 7, Article No. 43048 (2017), 17 pages, arXiv:1604.05796.

Nikesh S. Dattani et al., "Quantum factorization of 56153 with only 4 qubits," (2014), 6 pages, arXiv:1411.6758.

Nanyang Xu et al., "Quantum Factorization of 143 on a Dipolar-Coupling Nuclear Magnetic Resonance System," Phys. Rev. Lett. 108, 130501, Mar. 30, 2012, 5 pages, arXiv:1111.3726.

Vedran Dunjko et al., "Computational Speedups Using Small Quantum Devices," (2018), 18 pages, arXiv:1807.08970.

Evgeny Dantsin et al., "A deterministic $(2-2/(k+1))n$ algorithm for k-SAT based on local search," Theoretical Computer Science 289, pp. 69-83 (2002).

Robin A. Moser et al., "A full derandomization of Schöning's k-SAT algorithm," Proceedings of the 43rd Annual ACM Symposium on Theory of Computing—STOC '11 (ACM Press, New York, New York, USA, 2011) pp. 245-251.

John Preskill, "Quantum Computing in the NISQ era and beyond," arXiv preprint arXiv:1801.00862, pp. 1-20, 2018.

International Search Report and Written Opinion dated Dec. 4, 2019 in PCT Application No. PCT/US2019/046966, 8 pages.

Nikolaj Moll et al., "Quantum optimization using variational algorithms on near-term quantum devices," Quantum Science and Technology vol. 3, Jun. 19, 2018 [retrieved on Nov. 25, 2019]. Retrieved from <https://iopscience.iop.org/article/10.1088/2058-9565/aab822/pdf>.

Jarrod R McClean et al., "The theory of variational hybrid quantum-classical algorithms," New Journal of Physics. vol. 18, Feb. 5, 2016 [retrieved on Nov. 25, 2019], Retrieved from <https://iopscience.iop.org/nsearch?terms=jarrod+MCCLEAN+>.

Eric R. Anschuetz et al. "Variational Quantum Factoring," arXiv:1808.08927v1. Aug. 27, 2018 [retrieved on Nov. 25, 2019]. Retrieved from <https://arxiv. org/pdf/1808.08927.pdf>.

International Search Report & Written Opinion dated Jun. 24, 2022, in international application No. PCT/US2022/021521, 8 pages.

Marsh, S., and Wang, J.B., "Combinatorial optimization via highly efficient quantum walks," Physical Review Research, vol. 2, No. 2 023302 (2020), pp. 1-8 (Jun. 8, 2020).

Non-Final Office Action dated Jun. 24, 2022, in U.S. Appl. No. 16/844,011 of Yudong Cao, filed Apr. 9, 2020, 46 pages.

Non-Final Office Action dated Jun. 29, 2022, in U.S. Appl. No. 16/844,051 of Yudong Cao, filed April 9, 2020, 38 pages.

Anschuetz, E., et al., "Variational Quantum Factoring," Feb. 19, 2019, Advances in Databases and Information Systems; [Lecture Notes in Computer Science; Lect.Notes Computer], Springer International Publishing, Cham, pp. 74-85, XP047505564, ISBN: 978-3-319-10403-4.

Extended European Search Report dated Apr. 25, 2022, in European patent application No. 19850464.9, 11 pages.

Moll, N., et al., "Quantum optimization using variational algorithms on near-term quantum devices," Arxiv.org, Cornell University Library, 201 Olin Library Cornell University Ithaca, NY 14853, pp. 1-30 (Oct. 3, 2017), XP081147319, DOI: 10.1088/2058-9565/AAB822.

Wang, Z., et al., "The Quantum Approximation Optimization Algorithm for MaxCut: A Fermionic View," Arxiv.org, Cornell University, 201 Olin Library Cornell University Ithaca, NY 14853, pp. 1-13 (Jun. 9, 2017), XP081277838, DOI: 10.1103/PHYSREVA.97.022304.

Berry, D. W., et al., "Quantum algorithm for linear differential equations with exponentially improved dependence on precision", arXiv:1701.03684v2, pp. 1-20 (Feb. 17, 2017).

Whitfield, J. D., et al., "Simulation of electronic structure Hamiltonians using quantum computers", Molecular Physics, arXiv:1001.3855v3, vol. 109, No. 5, pp. 1-22 (2011).

Cao, Y., et al., "Quantum algorithm and circuit design solving the Poisson equation," New Journal of Physics, vol. 15, pp. 1-29 (Jan. 2013).

(56) References Cited

OTHER PUBLICATIONS

Berry, D. W., "High-order quantum algorithm for solving linear differential equations", Journal of Physics A: Mathematical and Theoretical, arXiv:1010.2745v2, vol. 47, No. 10, pp. 1-14 (Jan. 28, 2014).
Clader, B. D., et al., "Preconditioned quantum linear system algorithm", Phys. Rev. Lett., arXiv:1301.2340v4, vol. 110, No. 25, pp. 1-5 (May 7, 2013).
Shen, Y., et al., "Quantum implementation of unitary coupled cluster for simulating molecular electronic structure", arXiv:1506.00443v2, vol. 95, No. 2, pp. 1-6 (2015).
O'Malley, P. J. J., et al., "Scalable quantum simulation of molecular energies", Physical Review X, vol. 6, No. 3, pp. 031007-1-031007-13, (2016).
Chamorro-Posada, P., and Garcia-Escartin, J. C. "The SWITCH test for discriminating quantum evolutions", Quantum Physics, pp. 1-5 (2017).
McClean, J. R., et al., "Barren plateaus in quantum neural network training landscapes", Nature Communications, vol. 9, pp. 1-6, 2018.
Peruzzo, A., et al., "A variational eigenvalue solver on a photonic quantum processor", Nature Communications, vol. 5, Article No. 4213, pp. 1-7 (2014).
International Search Report and Written Opinion dated Jan. 29, 2020, in International Patent Application No. PCT/US2019/054316, 8 pages.
Romero, J., et al., "Strategies for quantum computing molecular energies using the unitary coupled cluster ansatz", arXiv:1701.02691v2 [quant-ph], vol. 4, No. 4, pp. 1-18 (Feb. 10, 2018).
Aaronson, S., "Quantum Machine Learning Algorithms: Read the Fine Print", Nature Physics, vol. 11, pp. 1-5 (2015).
Wiebe, N., et al., "Quantum Data Fitting", Phys. Rev. Lett., arXiv:1204.5242v2, pp. 1-6 (Jul. 3, 2012).
Childs, A. M., et al., "Quantum algorithm for systems of linear equations with exponentially improved dependence on precision", arXiv:1511.02306v2, pp. 1-31 (2017).
Rebentrost, P., et al., "Quantum support vector machine for big data classification", Physical Review Letters, arXiv:1307.0471v3, vol. 113, No. 3, pp. 1-5 (Jul. 10, 2014).
Abrams, D. S., and Lloyd, S., et al., "A quantum algorithm providing exponential speed increase for finding eigenvalues and eigenvectors", arXiv:quant-ph/9807070v1, vol. 83, No. 24, pp. 1-9 (Jul. 24, 1998).
Harrow, A. W., et al., "Quantum algorithm for linear systems of equations", Phys. Rev. Lett., vol. 103, No. 15, 1-15 (2009).
Nielsen, M. A., and Chuang, I. L., "Quantum Computation and Quantum Information", Cambridge University Press, pp. 1-704 (2000).
Preskill, J., "Quantum Computing in the NISQ era and beyond", Jul. 31, 2018, pp. 1-20.
Bravyi, L. D., et al., "Fermionic Quantum Computation", Annals of Physics, vol. 298, No. 1, pp. 210-226 (2002).
Cao, "Hybrid quantum-classical algorithm for variational coupled cluster method", APS March Meeting 2019, vol. 64, No. 2, Monday-Friday, March pp. 4-8, 2019; Boston, Massachusetts.
Berry, D. W. et al., "Simulating Hamiltonian Dynamics with a Truncated Taylor Series", Phys. Rev. Lett. 114, 090502 pp. 1-5, Mar. 3, 2015.
Brassard, G., et al., "Quantum Amplitude Amplification and Estimation", arXiv:quant-ph/0005055v1, pp. 1-22 (May 15, 2000).
Buhrman, H. et al., "Quantum fingerprinting", Physical Review Letters, vol. 87, Issue No. 16, pp. 1-8, Sep. 2001.
Childs, A. M. et al., "Quantum algorithm for systems of linear equations with exponentially improved dependence on precision", SIAM Journal on Computing vol. 46, Issue No. 6, pp. 1-31, Jan. 2017.
Childs, A. M. et al., "Hamiltonian simulation using linear combinations of unitary operations", Quantum Information and Computation, vol. 12, pp. 901-924 (2012).
Grover, L.K., "A fast quantum mechanical algorithm for database search", STOC '96: Proceedings of the twenty-eighth annual ACM symposium on Theory of Computing, pp. 1-8 (Jul. 1996).
Grover, L. K., "Fixed-point quantum search", Physical Review Letters, Issue No. 95, vol. 15, pp. 1-13, Oct. 2005.
Kothari, R., "Efficient algorithms in quantum query complexity", PhD thesis, University of Waterloo, pp. 1-128, 2014.
Yamada, S. et al., "High Performance LOBPCG Method for Solving Multiple Eigenvalues of Hubbard Model: Efficiency of Communication Avoiding Neumann Expansion Preconditione", In: Yokota R., Wu W. (eds) Supercomputing Frontiers. SCFA 2018. Lecture Notes in Computer Science, vol. 10776. Springer, Cham, pp. 243-256.
Theodore J. Y. et al., "Fixed-point quantum search with an optimal number of queries", Physical Review Letters, Issue No. 113, vol. 21, pp. 210501-5, Nov. 2014.
Voorhis T. V. et al., "Benchmark variational coupled cluster doubles results", Journal of Chemical Physics, 113 (20):8873-8879, 2000.
Harsha, G. et al., "On the difference between variational and unitary coupled cluster theories", J. Chem. Phys. vol. 148, 044107, pp. 1-6, (2018).
Evangelista, F. A., "Alternative single-reference coupled cluster approaches for multireference problems: The simpler, the better", Journal of Chemical Physics, vol. 134(22), pp. 1-13, 2011.
Nielsen, M., "The Fermionic canonical commutation relations and the Jordan-Wigner transform", michaelnielsen.org, pp. 1-8, 2005.
Seita, K. et al., "Bravyi-Kitaev Superfast simulation of fermions on a quantum computer", arXiv:1712.00446v3 pp. 1-13, 2017.
Schuch, N. and Verstraete, F., "Computational Complexity of interacting electrons and fundamental limitations of Density Functional Theory", Nature Physics, DOI: 10.1038/NPHYS1370, pp. 732-735 (Aug. 23, 2009).
Helgaker T. et al., "Molecular Electronic-Structure Theory", Book published by John Wiley & Sons, pp. 1-908 (2000).
Guerreschi, G. G., "Repeat-Until-Success circuits with fixed-point oblivious amplitude amplification", Phys. Rev. A 99, 022306 pp. 1-13, Aug. 10, 2018.
Terashima, H. et al., "Nonunitary quantum circuit", International Journal of Quantum Information, vol. 3, No. 4, pp. 1-19, Apr. 6, 2005.
Zujev, A., "Note on Non-Unitary Quantum Gates in Quantum Computing", Working Paper, University of California, Davis, DOI: 10.13140/RG.2.2.30712.85767, pp. 1-3, 2017.
International Search Report & Written Opinion dated Jul. 30, 2020, in international patent application No. PCT/US2019/054795, 8 pages.
Gingrich, R. M., and Williams, C. P., "Non-unitary probabilistic quantum computing", ACM, pp. 1-6 (Sep. 15, 2003).
Notice of Allowance dated Jun. 9, 2021 for U.S. Appl. No. 17/272,189 of Yudong CAO, filed Feb. 26, 2021, 16 pages.
G. E. Hinton et al., "Reducing the Dimensionality of Data with Neural Networks," Science, vol. 313, Jul. 28, 2006, pp. 504-508. Available online at https://www.cs.toronto.edu/~hinton/science.pdf.
MATLAB "Global Optimization Toolbox," The MathWorks, Inc., Copyright 1994-2021. 12 pages. Accessible at https://www.mathworks.com/products/global-optimization.html.
Tensorflow, "TensorFlow Core: Tutorial," 39 pages, Last updated May 20, 2021 UTC. Accessible at https://www.tensorflow.org/tutorials/.
Gómez-Bombarelli, R., et al., "Automatic Chemical Design Using a Data-Driven Continuous Representation of Molecules", ACS Cent. Sci., vol. 4, No. 2, pp. 268-276 (2018).
Airbus., "Airbus Quantum Computing Challenge: Bringing flight physics into the Quantum Era", <<https://www.airbus.com/innovation/industry-4-0/quantum-technologies/airbus-quantum-computing-challenge.html>>, pp. 1-3, Dec. 17, 2018).
International Search Report & Written Opinion dated Feb. 26, 2021, in international patent application No. PCT/US2020/059371, 8 pages.
Wang, G., et al., "Minimizing Estimation Runtime on Noisy Quantum Computers," PRX Quantum 2.1 pp. 010346-1-49 (2021).
Watson, J.D., et al., "The complexity of translationally invariant problems beyond ground state energies", arXiv preprint arXiv:2012.12717, pp. 1-58 (Dec. 23, 2020).

(56) References Cited

OTHER PUBLICATIONS

Subasi, Y., et al., "Quantum algorithms for systems of linear equations inspired by adiabatic quantum computing," Physical review letters, vol. 122, No. 6, pp. 1-9 (Nov. 29, 2018).
Seeley, J.T., et al., "The Bravyi-Kitaev transformation for quantum computation of electronic structure," The Journal of chemical physics, 137(22):224109, 2012. arXivi:1208.5986, pp. 1-38 (Aug. 29, 2012).
Somma, R. D., "Quantum eigenvalue estimation via time series analysis," New Journal of Physics, 21(12):123025, 2019. arXiv:1907.11748, pp. 1-10 (Sep. 4, 2020).
Szabo, A. and Ostlund, N.S., "Modern quantum chemistry: introduction to advanced electronic structure theory," Courier Corporation, 2012. pp. 1-479 (2012).
Somma, R. D., et al., "Spectral gap amplification," SIAM Journal on Computing, 42(2):593-610, 2013. arXiv:1110.2494, Mar. 30, 2012, 14 pages.
Rice, J.E., et al., "Quantum computation of dominant products in lithium-sulfur batteries," The Journal of Chemical Physics, 154(13):134115, 2021. arxiv2001.01120, pp. 1-7 (Jan. 4, 2020).
O'Brien, T. E., et al., "Calculating energy derivatives for quantum chemistry on a quantum computer," NPJ Quantum Information, vol. 5, No. 1, pp. 1-12 (2019).
Meir, Y., and Wingreen., "Landauer formula for the current through an interacting electron region," Physical review letters, vol. 68, No. 16, pp. 2512-2516, (Apr. 20, 1992).
McClean, J.R., et al., "The theory of variational hybrid quantum-classical algorithms," New Journal of Physics, vol. 18, No. 2, arXiv:1509.04279, pp. 1-20 (Sep. 14, 2015).
McArdle, S., et al., "Digital quantum simulation of molecular vibrations," Chemical science, 10(22):5725-5735, 2019. arXiv:1811.04069, pp. 1-14 (Jan. 23, 2020).
Lin, L, and Tong, Y., "Near-optimal ground state preparation," Quantum, 4:372,arXiv:2002.12508, pp. 1-22, (Dec. 6, 2020).
Huang, H., et al., "Near-term quantum algorithms for linear systems of equations," arXiv preprint arXiv:1909.07344, pp. 1-22 (Dec. 16, 2019).
Gharibian, S., et al., "The complexity of simulating local measurements on quantum systems," Quantum, 3:189, 2019. arXiv:1606.05626, pp. 1-38 (Apr. 7, 2020).
Gharibian, S., et al., "Oracle Complexity Classes and Local Measurements on Physical Hamiltonians," In 37th International Symposium on Theoretical Aspects of Computer Science (STACS 2020). Schloss Dagstuhl-Leibniz-Zentrum für Informatik, 2020. arXiv:1909.05981, pp. 1-38 (Sep. 12, 2019).
Ge, Y., et al., "Faster Ground State Preparation and High-Precision Ground Energy Estimation with Fewer Qubits," Journal of Mathematical Physics, vol. 60, No. 2,: arXiv:1712.03193, 1-25 (Feb. 2, 2018).
Gilyén, A., et al., "Quantum Singular Value Transformation and Beyond: Exponential Improvements for Quantum Matrix Arithmetics," In Proceedings of the 51st Annual ACM SIGACT Symposium on Theory of Computing, pp. 193-204, 2019. arXiv:1806.01838, Jun. 5, 2018, 67 pages.
Gonthier, J., et al., "Identifying challenges towards practical quantum advantage through resource estimation: the measurement roadblock in the variational quantum eigensolver," Quantum Physics, arXiv:2012.04001, pp. 1-27 (Dec. 7, 2020).
Cao, Y., et al., "Quantum Chemistry in the Age of Quantum Computing", Quantum Physics, arXiv:1812.09976v2, pp. 1-194 (Dec. 28, 2018).
Cao, Y., et al., "Potential of Quantum Computing for Drug Discovery," IBM Journal of Research and Development, vol. 62, Issue 6, pp. 6:1-6:20, (Dec. 2018).
Chakraborty, S., et al., "The Power of Blockencoded Matrix Powers: Improved Regression Techniques Via Faster Hamiltonian Simulation," arXiv preprint arXiv:1804.01973, pp. 1-58 (Sep. 3, 2018).
Bravo-Prieto, C., et al., "Variational Quantum Linear Solver," Quantum Physics, arXiv: 1909.05820, pp. 1-21 (Sep. 12, 2019).
Ambainis, A., "On physical problems that are slightly more difficult than QMA," In 2014 IEEE 29th Conference on Computational Complexity (CCC), pp. 1-12 (2014).
Aspuru-Guzik, A., et al., "Simulated Quantum Computation of Molecular Energies", Science, Quantum Physics, vol. 309, No. 5741, pp. 1-21 (Sep. 9, 2005).
Atia, Y., and Aharonov, D., "Fast-Forwarding of Hamiltonians and Exponentially Precise Measurements," Nature communications. Vol. 8, No. 1, pp. 1-9 (Nov. 17, 2017).
Notice of Allowance dated Aug. 12, 2022, in U.S. Appl. No. 16/844,051 of Yudong Cao, filed Apr. 9, 2020, 17 pages.
Notice of Allowance dated Aug. 26, 2022, for U.S. Appl. No. 16/864,998 of Yudong Cao, filed May 1, 2020, 48 pages.

* cited by examiner

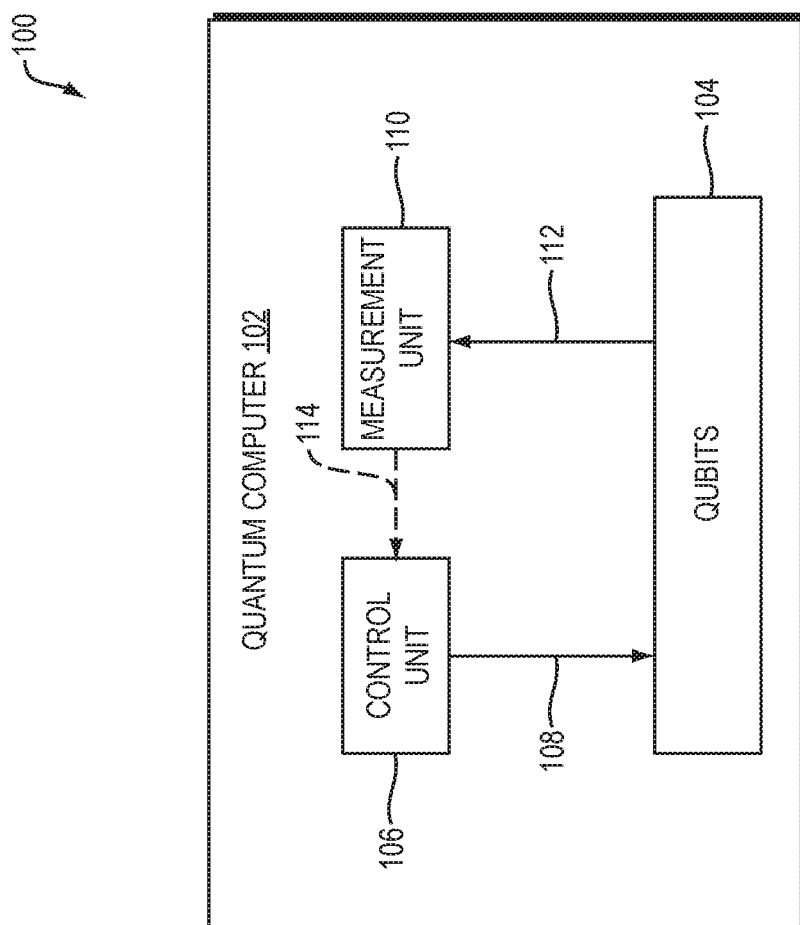

HYBRID QUANTUM-CLASSICAL COMPUTER SYSTEM AND METHOD FOR PERFORMING FUNCTION INVERSION

BACKGROUND

Quantum computers promise to solve industry-critical problems which are otherwise unsolvable or only very inefficiently addressable using classical computers. Key application areas include chemistry and materials, bioscience and bioinformatics, logistics, and finance. Interest in quantum computing has recently surged, in part due to a wave of advances in the performance of ready-to-use quantum computers.

The use of quantum computers for combinatorial optimization has always been an approach that is well motivated by the potential gain in leveraging uniquely quantum mechanical phenomena, such as superposition and entanglement. Quantum annealing techniques represent a well-known option for tapping into such potential gains. However, the power of gate model quantum machines for such optimization is relatively unexplored.

Function inversion arises pervasively in many protocols of cryptography such as cryptocurrency systems. The goal of function inversion is, for a given Boolean function f and an output bit string y, to find the input string x such that f(x)=y. In many cases f may be expressed as a sequence of elementary logic gates such as AND, OR and NOT.

SUMMARY

A hybrid quantum-classical (HQC) computing system, including a quantum computing component and a classical computing component, computes the inverse of a Boolean function for a given output. The HQC computing system translates a set of constraints into interactions between quantum spins; forms, from the interactions, an Ising Hamiltonian whose ground state encodes a set of states of a specific input value that are consistent with the set of constraints; performs, on the quantum computing component, a quantum optimization algorithm to generate an approximation to the ground state of the Ising Hamiltonian; and measures the approximation to the ground state of the Ising Hamiltonian, on the quantum computing component, to obtain a plurality of input bits which are a satisfying assignment of the set of constraints.

As shown in FIG. 4, embodiments of the present invention include a method 400 which takes as input a Boolean function f 402 which maps one or more input bits to one or more output bits. In some embodiments, the Boolean function describes a hashing algorithm or an implementation of a one-way function whose output provides little information about the input which generates the output.

After receiving the description of the Boolean function, the method assigns a set of output bits satisfying a set of conditions. In some embodiments, the Boolean function corresponds to a hashing algorithm and the output is the hash value for which the corresponding input string which generates the hash value is sought.

Following the assignment of the output bits corresponding to the condition, the method then obtains a description of the relationship between input and intermediate bits. In some embodiments the relationship is a set of equations relating the input bits and the intermediate bits. In other embodiments, the relationship is a set of equations describing the action of elementary logic gates for implementing the Boolean function.

Following the establishment of a description of the relationship between the input and intermediate bits, the method then obtains an input whose image under the Boolean function satisfies the condition. In some embodiments, the input is a message whose hash value under some hash function is given.

As shown in FIG. 5, in other embodiments, the Boolean function is generated by taking as input a classical logical circuit (of elementary gate operations such as AND, NOT, OR, etc.) with input and output bits. In some embodiments, the classical logical circuit is a sequence of elementary gate operations.

Following the description of the logical circuit, the method for generating the Boolean function further comprises computing a description of the relationship between the input bits, output bits, and intermediate bits of the classical logical circuit by inspecting the sequence of elementary gate operations in the classical logical circuit.

Following the computation of the description of the relationship between the input bits, output bits, and intermediate bits, the method for generating the Boolean function further comprises generating the expression for the Boolean function from the description.

As shown in FIG. 6, in some embodiments, the description of the relationship between input bits, intermediate bits, and output bits is further simplified by a preprocessing step on a classical computer to produce a new set of relationship between input bits, intermediate bits, and output bits. This preprocessing step may, for example, involve a reduction in the number of variables or equations describing the function. In some embodiments, the reduction could comprise solving a subset of equations using a known algebraic relationship.

In some embodiments, and as shown in FIG. 7, the method of obtaining an input which satisfies the condition comprises translating the relationship between input bits and intermediate bits into a set of constraints.

Following the translation of the relationship between input bits, intermediate bits, and output bits into a set of constraints, the method further translates the constraints into interactions between quantum spins. In general, the constraints may be polynomial functions of binary variables (bits). To perform the translation into quantum spin interactions, embodiments of the present invention may map each bit x to an expression $(1-s1)/2$, where s1 is a binary variable which is equal to either 1 or −1, in contrast to x, which is either 0 or 1.

Following the generation of constraints from each Boolean equation in the relationship between input bits, intermediate bits, and output bits, the method may further sum the interaction terms together to form an Ising Hamiltonian whose ground state encodes a set of states of the input bits and intermediate bits that are consistent with the relationship between input bits and intermediate bits.

Following the construction of the Ising Hamiltonian, the ground state (or approximate ground state) of the Ising Hamiltonian may be obtained by performing a quantum optimization algorithm on a quantum computer or a classical computer simulation of a quantum computer. In some embodiments, the quantum optimization algorithm may include running the quantum approximate optimization algorithm (QAOA). The solution to the relationship between the input bits and output bits may then be extracted from the ground state of the Ising Hamiltonian. In some embodiments, the measurement values corresponding to qubits in the ground state are identical to input bits which satisfy the desired condition. In other embodiments, the measurement values corresponding to qubits in the ground state or approximate ground state may be provided to another function to obtain the desired input bits.

Other features and advantages of various aspects and embodiments of the present invention will become apparent from the following description and from the claims.

BRIEF DESCRIPTION OF THE DRAWINGS

FIG. 1 is a diagram of a quantum computer according to one embodiment of the present invention;

DETAILED DESCRIPTION

Embodiments of the present invention are directed to a hybrid quantum-classical (HQC) computer which computes or approximately computes the inverse of a Boolean function for a given output.

Figure 4:
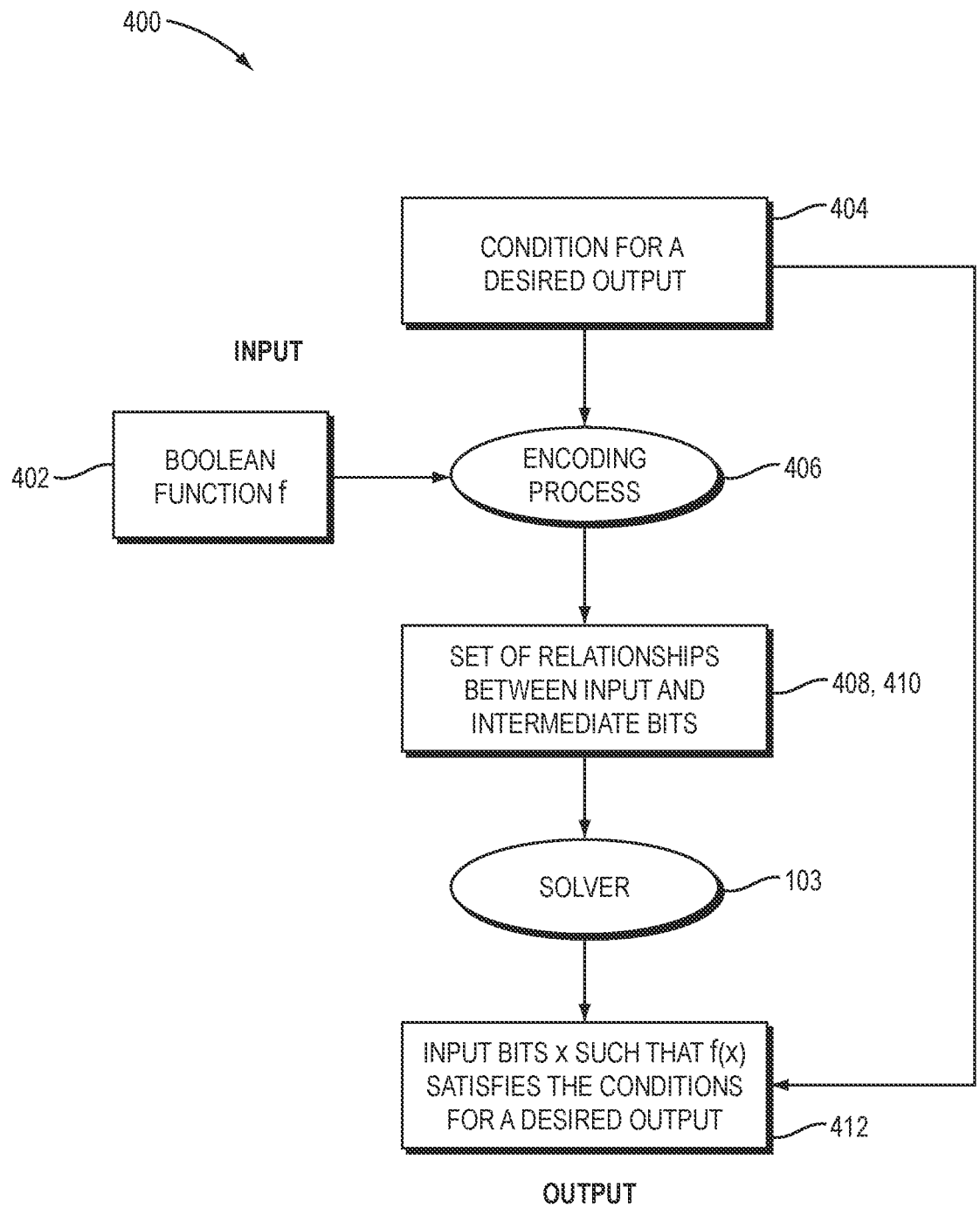
FIG. 4 is a flowchart of a method performed by a hybrid quantum-classical computing system to invert a Boolean function according to one embodiment of the present invention.

FIG. 4 is a flowchart of a method 400 performed by certain embodiments of the present invention. As shown in FIG. 4, the method 400 receives as input a Boolean function 402 which maps one or more input bits to one or more output bits. In some embodiments the Boolean function 402 implements a hashing algorithm or a one-way function whose output provides little information about the input which generates the output.

In other embodiments, the Boolean function 402 implements integer multiplication, in which case the output bits correspond to an integer to be factored, the integer to be factored being equal to the product of two or more integers represented by the input bits.

Following receipt of the Boolean function 402, the method 400 assigns a set of output bits satisfying a set of one or more conditions 404. For example, if the conditions 404 require the first 10 bits of the output to be 0, then the 10 corresponding output bits of the Boolean function 402 will be assigned 0. If the conditions require that at least the first 10 bits should be 0, then choosing the first 11 bits of the output to be 0 will also suffice. In some embodiments, the Boolean function 402 implements a hashing algorithm and the output is the hash value for which the corresponding input string which generates the hash value is sought. For instance, the hashing algorithm SHA-256 is involved in the process of mining cryptocurrencies such as Bitcoin. To mine a block, an input must be found whose hash satisfies a constraint corresponding to the difficulty of the block. One embodiment of the input bits 414 is a bit-string satisfying such a constraint.

Following the assignment of the output bits corresponding to the conditions 404, the method 400 then obtains 406 a description 408 of the relationship (or a first description 408 of the relationship and a second description 410 of the relationship) between input bits and intermediate bits. Any reference herein to "the relationship 408/410" or to "the relationship 408" should be understood to encompass both embodiments in which only the relationship description 408 is obtained and processed, and embodiments in which both the relationship description 408 and the relationship description 410 are obtained and processed. In some embodiments, the relationship 408/410 is a set of equations relating the input bits and the intermediate bits. In other embodiments, the relationship 408/410 is a set of equations describing the action of elementary logic gates for implementing the Boolean function 402. One embodiment is the set of equations describing the relationship 408/410 between input bits and output bits specified according to condition 404 in the SHA-256 hashing algorithm.

Following the establishment of a description of the relationship 408/410 between the input bits and intermediate bits, the method 400 obtains (using solver 103) an input 412 whose image under the Boolean function 402 satisfies the condition 404. In some embodiments, the input 412 is a message whose hash value under some hash function is given.

Figure 5:
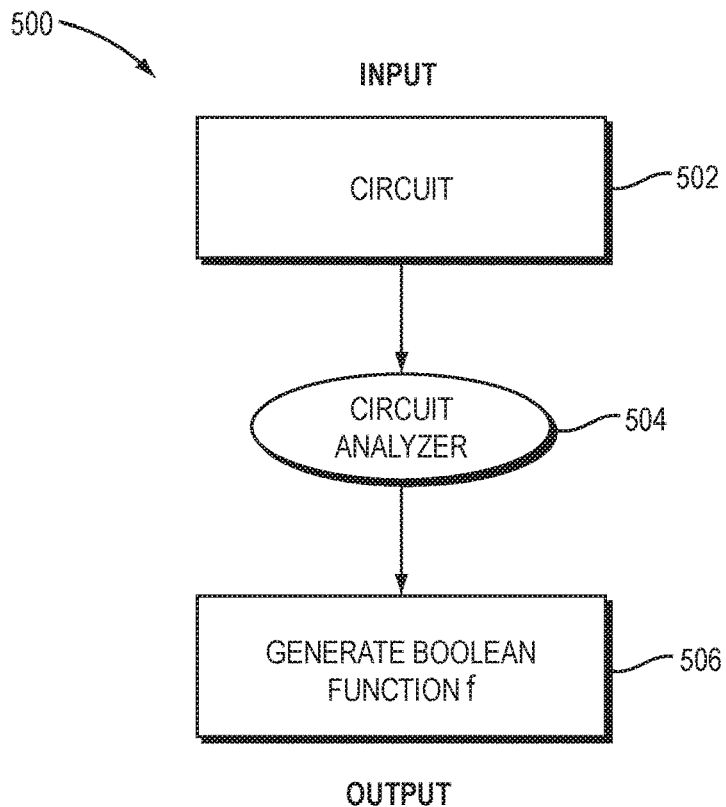
FIG. 5 is a flowchart of a method performed by a hybrid quantum-classical computing system to generate a Boolean function according to one embodiment of the present invention.

As shown in FIG. 5, in other embodiments, a method 500 generates the Boolean function 402 by taking as input a description of a classical logical circuit 502 (of elementary gate operations such as AND, NOT, OR, and XOR) with input and output bits. In some embodiments, the classical logical circuit 502 is a sequence of elementary gate operations.

Following receiving the description of the logical circuit 502, the method 500 for generating the Boolean function 402 further includes using a circuit analyzer to compute 504 a description of the relationship between the input bits, output bits, and intermediate bits of the classical logical circuit 502 by inspecting the sequence of elementary gate operations in the classical logical circuit 502. For example, if the classical logical circuit 502 consists of a single logical AND gate, then that circuit 502 takes as input two bits x and y and produces an output z. The description for the classical logical circuit 502 in this case would be z=xy. In this example, no intermediate bits are involved. However, more general cases with more than one gate may involve one or more intermediate bits.

Following the computation 504 of the description of the relationship between the input bits, output bits, and intermediate bits, the method 500 for generating the Boolean function 402 further includes generating 506 the expression for the Boolean function 402 from the description 408/410. For example, if the classical logical circuit 502 comprises the following gates:

$x$ AND $y \rightarrow z$ $u$ OR $v \rightarrow w$ $w$ AND $z \rightarrow q$ then that circuit 502 may be described in the previous step using the relationships:

$z = xy$ $w = (u+v) \bmod 2$ $q = wz$.

The resulting Boolean function 402 is then $q = f(x,y,u,v) = (u+v)xy$.

Figure 6:
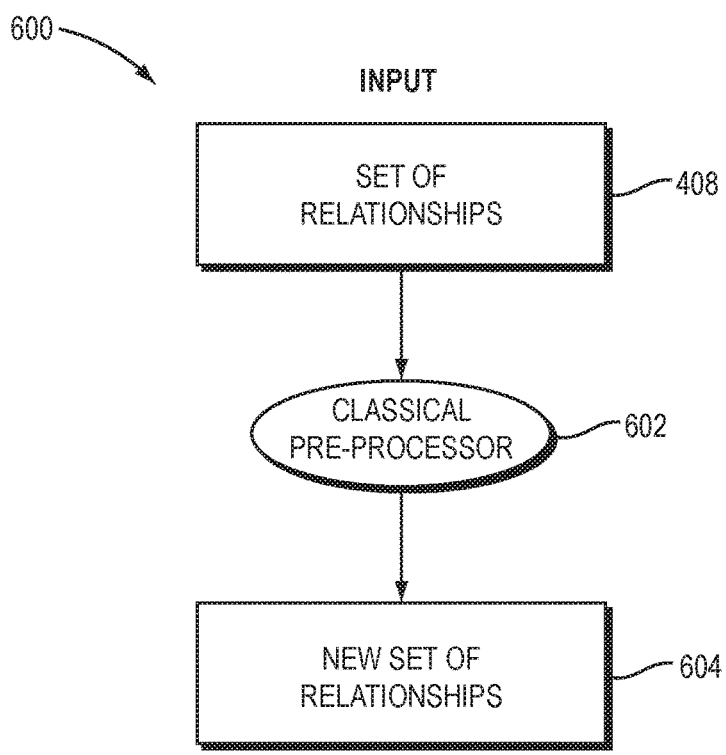
FIG. 6 is a flowchart of a method performed by a classical computing component of a hybrid quantum-classical computing system to pre-process a description of a set of relationships according to one embodiment of the present invention.

As shown in FIG. 6, in some embodiments, the description 408 of the relationship between input bits, intermediate bits, and output bits is further simplified by using a classical computer to perform preprocessing 602 to produce a new description 604 of relationships between input bits, intermediate bits, and output bits. This preprocessing 602 may, for example, involve a reduction in the number of variables or equations describing the function 402. In some embodiments, the reduction may, for example, comprise solving a subset of equations using a known algebraic relationship. For example, the variables x and y may be replaced by 1 if the set of equations contains $xy=1$.

Figure 7:
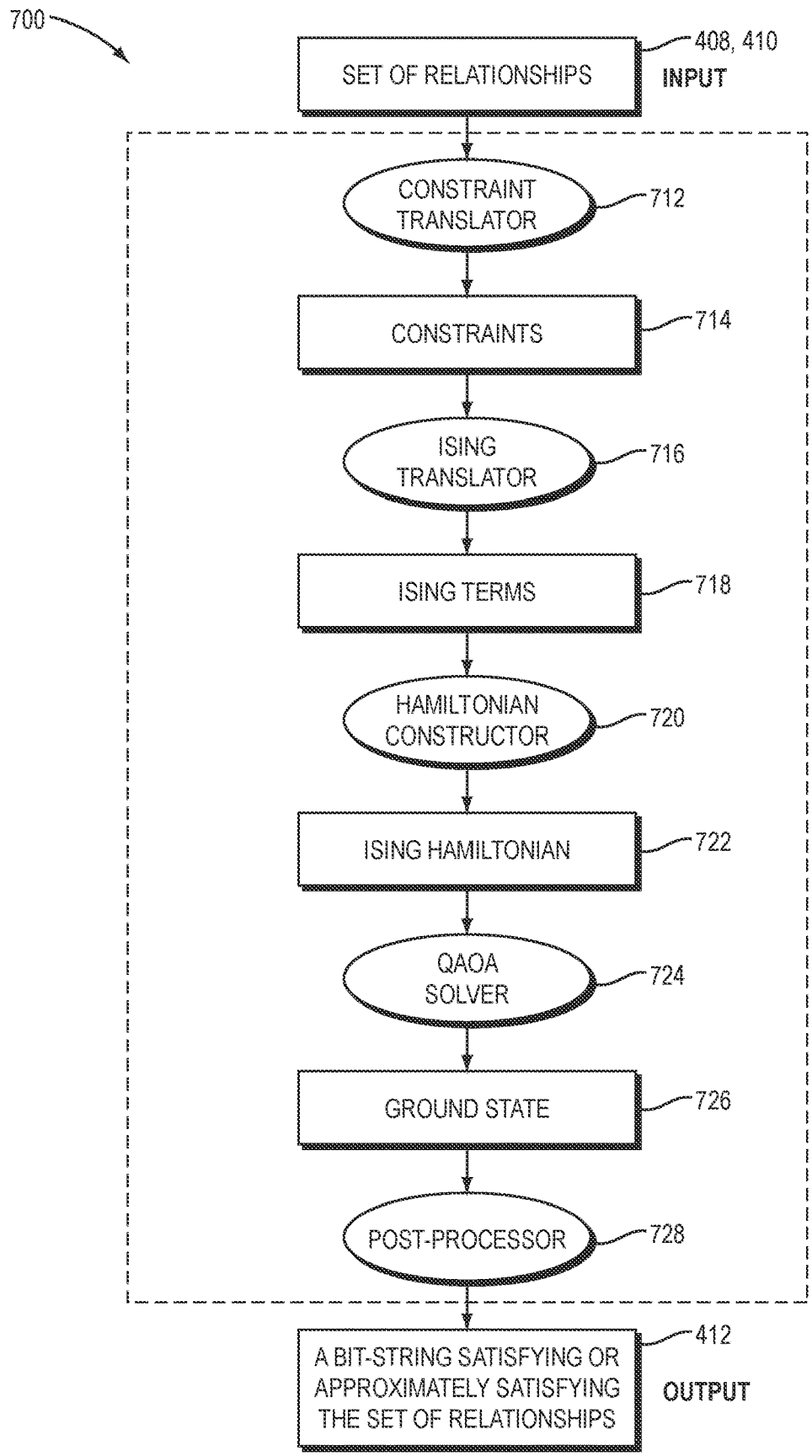
FIG. 7 is a flowchart of a method performed by a hybrid quantum-classical computing system to translating relationships between input bits and intermediate bits into a set of constraints according to one embodiment of the present invention.

As illustrated by the method 700 of FIG. 7, in some embodiments, obtaining an input 412 which satisfies the condition 404 includes translating 712 the relationship 408/410 between input bits and intermediate bits into a set of constraints 714. For example, if bits x, y, and z are related by an AND gate (i.e., the relationship $z=xy$), the constraint that the relationship translates to is $(z-xy)^2$. In some embodiments, for any relationship of the form L=R, where L and R are algebraic expressions of binary variables (bits), the method 700 translates the relationship into a constraint $(L-R)^2$.

Following the translation of the relationship 408/410 between input bits, intermediate bits, and output bits into a set of constraints 714, the method 700 further translates 716 the constraints 714 into interactions 718 between quantum spins. In general, the constraints 714 are polynomial functions of binary variables (bits). To perform the translation 716 into quantum spin interaction, each bit x may be mapped to an expression $(1-s1)/2$, where s1 is a binary variable which is equal to either 1 or −1, in contrast to x, which is either 0 or 1. For example, the constraint $(z-xy)^2$ then translates to:

$[(1-s3)/2-(1-s1)(1-s2)/4]^2$ which is a degree-4 polynomial in $s_i$ variables.

Following the generation of constraints 714 from each Boolean equation in the relationship 408/410 between input bits, intermediate bits, and output bits, the method 700 further includes summing 720 the interaction terms 718 together to form an Ising Hamiltonian 722 whose ground state encodes a set of states of the input bits and intermediate bits that are consistent with the relationship 408/410 between input bits and intermediate bits. For example, the relationship between input bits x, y, u and output bit z $w=xy$ $z=w+u \pmod 2$ may be translated to constraints $(w-xy)^2$ $(z-w-u)^2$ which may be further translated to Ising interaction terms $[(1-s_3)/2-(1-s_1)(1-s_2)/4]^2$ $[(1-s_5)/2-(1-s_3)/2-(1-s_4)/2]^2$ under the variable transformation $x=(1-s_1)/2$, $y=(1-s_2)/2$, $w=(1-s_3)/2$, $u=(1-s_4)/2$, $z=(1-s_5)/2$. The Hamiltonian 722 formed in the current step is then $H=[(1-s_3)/2-(1-s_1)(1-s_2)/4]^2+[(1-s_5)/2-(1-s_3)/2-(1-s_4)/2]^2$.

Following the construction of the Ising Hamiltonian 722, the ground state or approximate ground state 726 of the Ising Hamiltonian 722 may be obtained by performing a quantum optimization algorithm 724 on a quantum computer (such as a quantum computing component of an HQC computer) or a classical computer simulation of a quantum computer. In some embodiments, the quantum optimization algorithm 724 may be the quantum approximate optimization algorithm (QAOA), but this is merely an example and not a limitation of the present invention. The solution (input 412) to the relationship 408/410 between the input bits and output bits may then be extracted 728 from the ground state 726 of the Ising Hamiltonian. In some embodiments, the measurement values corresponding to qubits in the ground state are identical to input bits which satisfy the desired condition 404. In other embodiments, the measurement values corresponding to qubits in the ground state or approximate ground state 726 may be provided to a classical postprocessor, which processes those measurement values to produce the input bits 412 as output.

As described above, in some embodiments the Boolean function may be integer multiplication, in which case embodiments of the present invention may perform integer factorization by finding the two or more input values that are factors of a known output value. Such embodiments may perform integer factorization using a combination of quantum and classical computer components. Quantum computers implemented according to embodiments of the present invention may require only low-depth noisy quantum circuits. Furthermore, quantum computers implemented according to embodiments of the present invention may be smaller than the problem instance itself (i.e., the quantum computer may have fewer qubits than the number of input binary variables in the problem). In contrast, the current canonical approach (Shor's algorithm) requires deep circuits running on a fault-tolerant quantum computer with thousands of logical qubits, which may still not be capable of being implemented for decades. As a result, embodiments of the present invention are improved quantum computers which are capable of being implemented today to perform computations more efficiently than existing quantum computers.

Figure 8A:
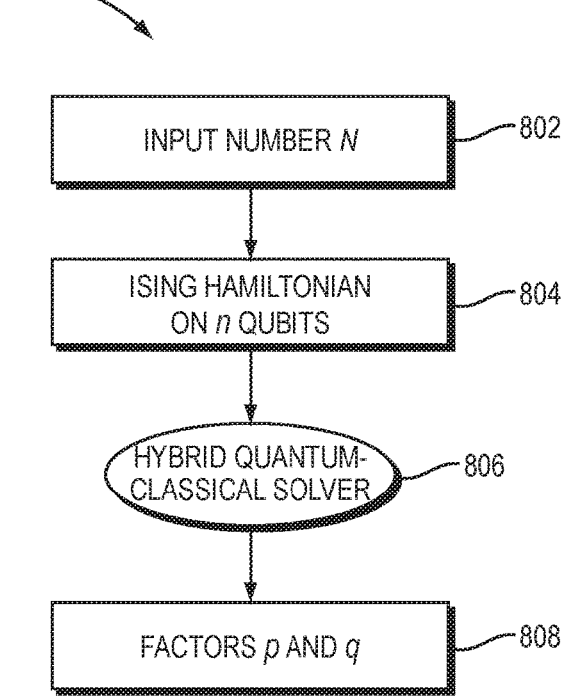
FIGS. 8A and 8B are flowcharts of methods performed by a hybrid quantum-classical computing system to perform integer factorization according to one embodiment of the present invention.
Figure 8B:
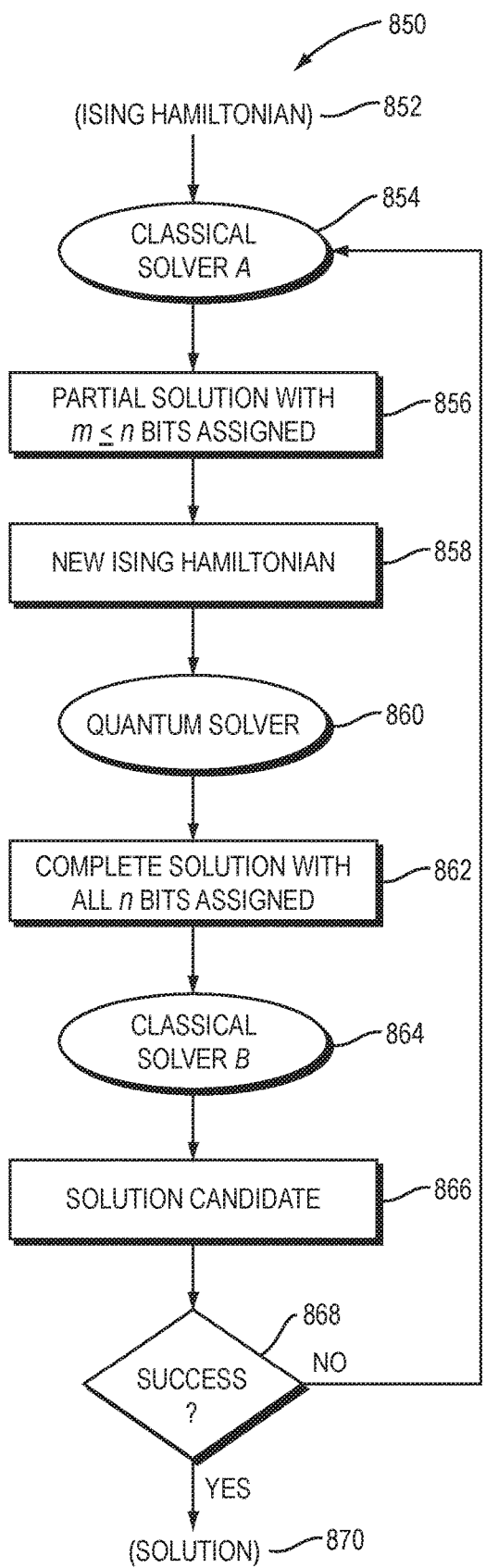

For example, referring to FIGS. 8A and 8B, flowcharts are shown of methods 800 and 850 for performing integer factorization according to embodiments of the present invention. The method 800 of FIG. 8A receives an input number N (FIG. 8, element 802) to be factored, and prepares 804 an Ising Hamiltonian acting on n qubits. A hybrid quantum-classical solver 806 then produces 808, based on the input number N, factors p and q of N.

The method 850 of FIG. 8B includes maintaining and updating a set of solution candidates, while checking whether any of the candidates gives rise to valid factorization of the input, and terminates once a satisfying solution has been found. In particular, to account for the fact that near-term quantum computers may not have enough qubits to accommodate the entire factoring problem, the method 850 of FIG. 8B uses a hybrid quantum-classical approach to generate solution candidates. To produce an n-bit candidate, with n possibly greater than the number of qubits available on the quantum computer, the method 850 of FIG. 8B first provides an initial Ising Hamiltonian 852 as an input to a classical computer 854 ("classical solver A," also referred to as a "classical presolver"), which assigns 856 m bits, giving rise to a new Hamiltonian 858 acting on considerably fewer qubits than the n qubits which can be fit onto the quantum computer ("partial solution with m≤n bits assigned"). The goal of the classical solver A 854 is to directly solve the factoring problem on a subset of bit variables efficiently, directly lowering the resource requirements of the quantum solver used by a quantum computer. Then, the method 850 uses a quantum computer 860 ("quantum solver") to find an optimized state for the new Hamiltonian ("New Ising Hamiltonian") 858, which assigns values to the remaining bits in the n-bit string. The completed string ("Completed solution with all n bits assigned") 862 is then fed into the classical computer ("classical solver B," also referred to as a "classical postsolver") 864, which maintains and updates solution candidates ("solution candidate") 866. The goal of the classical solver B 864 is to process samples drawn from the output state of the quantum solver 860, thereby reducing the precision requirements of the quantum solver 860. Then the solution candidate(s) 866 is checked 868 ("Success?") to see if it gives rise to the correct factors. If it does, then the method 850 identifies 870 factors p and q from the solution. Otherwise, the method 850 feeds back information about the solution candidate 866 back into the classical solver A 854 to guide its action in the next iteration of the method 850.

Examples of the classical solver A 854 in FIG. 8B include a classical Boolean equation reducer and a PromiseBall solver. The classical solver B in FIG. 8B may be implemented using, for example, simulated annealing and genetic algorithms, which maintain and update n-bit strings to produce improved batches of solution candidates. On near-term devices, the quantum solver 860 in FIG. 8B may, for example, be implemented using the quantum approximate optimization algorithm or the hardware efficient variational quantum eigen-solver, which have proven effective in solving ground states of Ising Hamiltonians and (by equivalence reduction) a few problems that are NP-complete.

Quantum computers implemented according to embodiments of the present invention improve upon the recent variational quantum algorithm strategy, based on the insight that factoring can be mapped to finding the ground state of an Ising Hamiltonian. The variational nature of the algorithm makes possible for embodiments of the present invention to perform integer factorization using existing low-depth noisy quantum circuits, without requiring higher-depth and/or noiseless quantum circuits. This ability of embodiments of the present invention to be implemented using low-depth noisy quantum circuits is a significant advantage of embodiments of the present invention over existing techniques for using quantum computers to perform integer factorization.

One aspect of the present invention is directed to a method for use with: a Boolean function which maps at least one input bit to at least one output bit; a seed output value, wherein the seed output value satisfies at least one condition; and a set of constraints such that a satisfying assignment of the constraints corresponds to a specific input value being mapped by the Boolean function to the seed output value. The method includes: (A) using a hybrid quantum-classical computer to find a satisfying assignment of the constraints, comprising: (A)(1) translating the constraints into interactions between quantum spins; (A)(2) forming, from the interactions, an Ising Hamiltonian whose ground state encodes a set of states of the specific input value that are consistent with the set of constraints; (A)(3) performing a quantum optimization algorithm on a quantum computing component of the hybrid quantum-classical computer to generate an approximation to the ground state of the Ising Hamiltonian; and (A)(4) measuring the approximation to the ground state of the Ising Hamiltonian, on the quantum computing component, to obtain a plurality of input bits which are a satisfying assignment of the set of constraints.

The at least one condition may be satisfied by a specific value, and the seed output value may be the specific value. The method may further include: (B) before (A), generating the set of constraints using a classical computer. (B) may include: (B)(1) receiving as input a description of a classical logical circuit, the classical logical circuit mapping the at least one input bit to the at least one output bit; and (B)(2) computing a description of the set of constraints as a function of an intermediate state of the classical logical circuit based on a sequence of elementary gate operations in the classical logical circuit. The classical logical circuit may implement at least one elementary gate operation selected from the set consisting of AND, NOT, OR, and XOR operations. (B) may include simplifying the set of constraints by performing a preprocessing step on the classical computing component.

Measuring the approximation to the ground state of the Ising Hamiltonian may be performed by the quantum computing component of the hybrid quantum-classical computer. Translating the constraints into interactions between quantum spins may be performed by a classical computing component of the hybrid quantum-classical computer. Forming the Ising Hamiltonian may be performed by a classical computing component of the hybrid quantum-classical computer.

Another aspect of the present invention is directed to a hybrid quantum-classical computing system for use with: a Boolean function which maps at least one input bit to at least one output bit; a seed output value, wherein the seed output value satisfies at least one condition; and a set of constraints such that a satisfying assignment of the constraints corresponds to a specific input value being mapped by the Boolean function to the seed output value. The hybrid quantum-classical computing system may include: a quantum computing component having a plurality of qubits and a qubit controller that manipulates the plurality of qubits; and a classical computing component storing machine-readable instructions that, when executed by the classical computer, control the classical computer to cooperate with the quantum computer to: translate the constraints into interactions between quantum spins; form, from the interactions, an Ising Hamiltonian whose ground state encodes a set of states of the specific input value that are consistent with the set of constraints; perform, on the quantum computing component, a quantum optimization algorithm to generate an approximation to the ground state of the Ising Hamiltonian; and measure the approximation to the ground state of the Ising Hamiltonian, on the quantum computing component, to obtain a plurality of input bits which are a satisfying assignment of the set of constraints.

The at least one condition may be satisfied by a specific value, and the seed output value may be the specific value. The machine-readable instructions may further include instructions to control the classical computing component to generate the set of constraints.

Controlling the classical computing component to generate the set of constraints may include controlling the classical computing component to: receive as input a description of a classical logical circuit, the classical logical circuit mapping the at least one input bit to the at least one output bit; and compute a description of the set of constraints as a function of an intermediate state of the classical logical circuit based on a sequence of elementary gate operations in the classical logical circuit. The classical logical circuit may implement at least one elementary gate operation selected from the set consisting of AND, NOT, OR, and XOR operations. Controlling the classical computing component to generate the set of constraints may include simplifying the set of constraints by performing a preprocessing step on the classical computing component.

Measuring the approximation to the ground state of the Ising Hamiltonian may be performed by the quantum computing component of the hybrid quantum-classical computer. Translating the constraints into interactions between quantum spins may be performed by the classical computing component of the hybrid quantum-classical computer. Forming the Ising Hamiltonian may be performed by the classical computing component of the hybrid quantum-classical computer.

Figure 9:
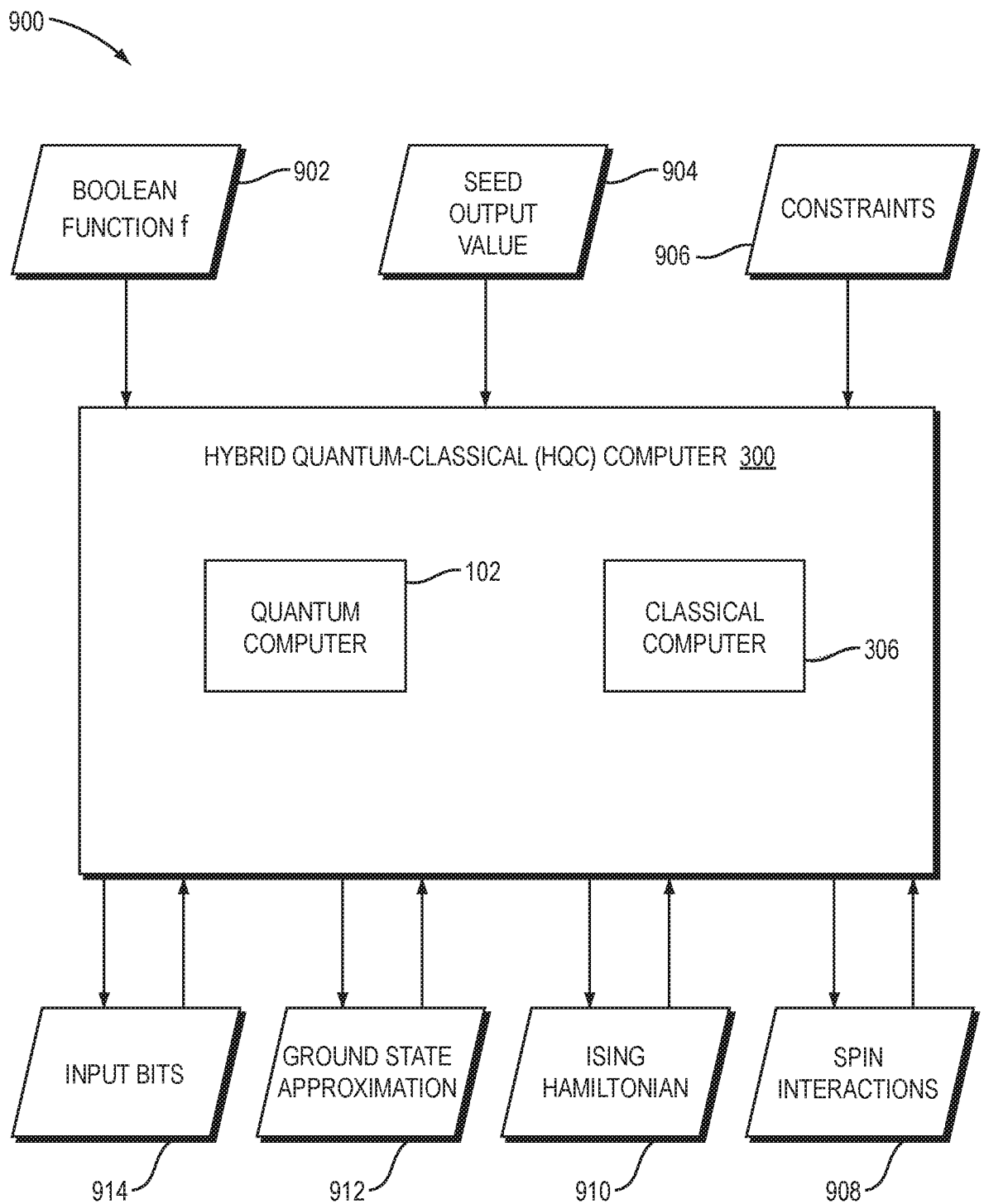
FIG. 9 is a diagram of a system for inverting a Boolean function according to one embodiment of the present invention.
Figure 10:
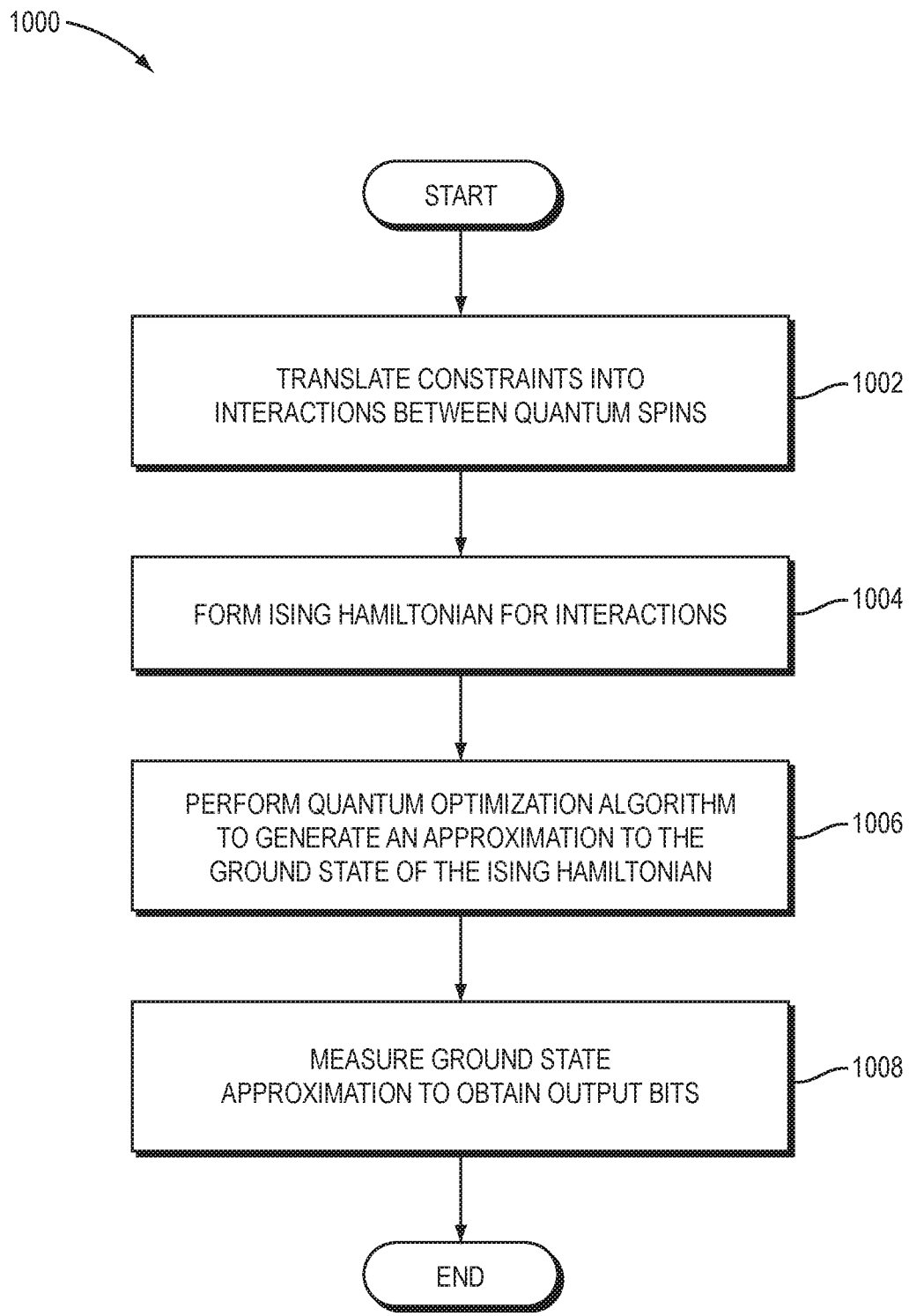
FIG. 10 is a flowchart of a method performed by the system of FIG. 9 according to one embodiment of the present invention.

For example, referring to FIG. 9, a diagram is shown of a system 900 for inverting a Boolean function f 902 according to one embodiment of the present invention. Referring to FIG. 10, a flowchart is shown of a method 1000 performed by the system 900 according to one embodiment of the present invention.

The system 900 includes a description of a Boolean function f 902, which maps at least one input bit to at least one output bit. The system 900 also includes a seed output value 904, which satisfies at least one condition. The system 900 also includes a set of one or more constraints 906, such that a satisfying assignment of the constraints 906 corresponds to a specific input value being mapped by the Boolean function 902 to the seed output value 904.

Figure 3:
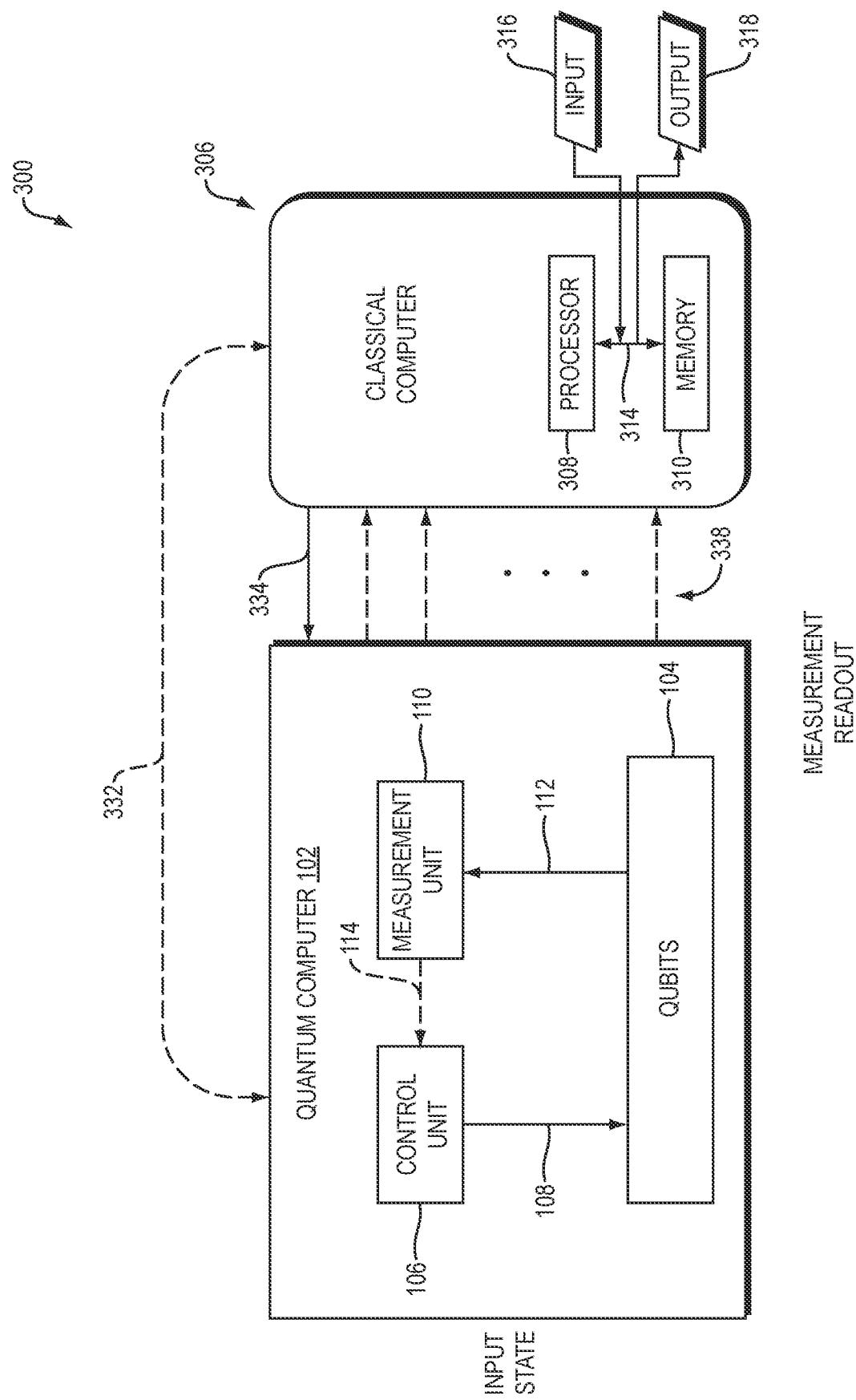
FIG. 3 is a diagram of a hybrid quantum-classical computer according to one embodiment of the present invention.

The system 900 also includes the hybrid quantum-classical (HQC) computer 300 of FIG. 3, which may be implemented in any of the ways disclosed herein. The HQC computer 300 may find a satisfying assignment of the constraints 906 in any of a variety of ways, such as the following. The HQC computer 300 may translate the constraints 906 into interactions 908 between quantum spins (FIG. 10, operation 1002). The HQC computer 300 may form, from the interactions 908, an Ising Hamiltonian 910 whose ground state encodes a set of states of the specific input value that are consistent with the set of constraints 906 (FIG. 10, operation 1004). The quantum computing component 102 of the HQC computer 300 may perform a quantum optimization algorithm to generate an approximation 912 to the ground state of the Ising Hamiltonian (FIG. 10, operation 1006). The quantum computing component 102 may measure the approximation 912 to the ground state of the Ising Hamiltonian 910 to obtain a plurality of input bits 914 which are a satisfying assignment of the set of constraints 906 (FIG. 10, operation 1008).

It is to be understood that although the invention has been described above in terms of particular embodiments, the foregoing embodiments are provided as illustrative only, and do not limit or define the scope of the invention. Various other embodiments, including but not limited to the following, are also within the scope of the claims. For example, elements and components described herein may be further divided into additional components or joined together to form fewer components for performing the same functions.

Various physical embodiments of a quantum computer are suitable for use according to the present disclosure. In general, the fundamental data storage unit in quantum computing is the quantum bit, or qubit. The qubit is a quantum-computing analog of a classical digital computer system bit. A classical bit is considered to occupy, at any given point in time, one of two possible states corresponding to the binary digits (bits) 0 or 1. By contrast, a qubit is implemented in hardware by a physical medium with quantum-mechanical characteristics. Such a medium, which physically instantiates a qubit, may be referred to herein as a "physical instantiation of a qubit," a "physical embodiment of a qubit," a "medium embodying a qubit," or similar terms, or simply as a "qubit," for ease of explanation. It should be understood, therefore, that references herein to "qubits" within descriptions of embodiments of the present invention refer to physical media which embody qubits.

Each qubit has an infinite number of different potential quantum-mechanical states. When the state of a qubit is physically measured, the measurement produces one of two different basis states resolved from the state of the qubit. Thus, a single qubit can represent a one, a zero, or any quantum superposition of those two qubit states; a pair of qubits can be in any quantum superposition of 4 orthogonal basis states; and three qubits can be in any superposition of 8 orthogonal basis states. The function that defines the quantum-mechanical states of a qubit is known as its wavefunction. The wavefunction also specifies the probability distribution of outcomes for a given measurement. A qubit, which has a quantum state of dimension two (i.e., has two orthogonal basis states), may be generalized to a d-dimensional "qudit," where d may be any integral value, such as 2, 3, 4, or higher. In the general case of a qudit, measurement of the qudit produces one of d different basis states resolved from the state of the qudit. Any reference herein to a qubit should be understood to refer more generally to a d-dimensional qudit with any value of d.

Although certain descriptions of qubits herein may describe such qubits in terms of their mathematical properties, each such qubit may be implemented in a physical medium in any of a variety of different ways. Examples of such physical media include superconducting material, trapped ions, photons, optical cavities, individual electrons trapped within quantum dots, point defects in solids (e.g., phosphorus donors in silicon or nitrogen-vacancy centers in diamond), molecules (e.g., alanine, vanadium complexes), or aggregations of any of the foregoing that exhibit qubit behavior, that is, comprising quantum states and transitions therebetween that can be controllably induced or detected.

For any given medium that implements a qubit, any of a variety of properties of that medium may be chosen to implement the qubit. For example, if electrons are chosen to implement qubits, then the x component of its spin degree of freedom may be chosen as the property of such electrons to represent the states of such qubits. Alternatively, the y component, or the z component of the spin degree of freedom may be chosen as the property of such electrons to represent the state of such qubits. This is merely a specific example of the general feature that for any physical medium that is chosen to implement qubits, there may be multiple physical degrees of freedom (e.g., the x, y, and z components in the electron spin example) that may be chosen to represent 0 and 1. For any particular degree of freedom, the physical medium may controllably be put in a state of superposition, and measurements may then be taken in the chosen degree of freedom to obtain readouts of qubit values.

Certain implementations of quantum computers, referred to as gate model quantum computers, comprise quantum gates. In contrast to classical gates, there is an infinite number of possible single-qubit quantum gates that change the state vector of a qubit. Changing the state of a qubit state vector typically is referred to as a single-qubit rotation, and may also be referred to herein as a state change or a single-qubit quantum-gate operation. A rotation, state change, or single-qubit quantum-gate operation may be represented mathematically by a unitary 2×2 matrix with complex elements. A rotation corresponds to a rotation of a qubit state within its Hilbert space, which may be conceptualized as a rotation of the Bloch sphere. (As is well-known to those having ordinary skill in the art, the Bloch sphere is a geometrical representation of the space of pure states of a qubit.) Multi-qubit gates alter the quantum state of a set of qubits. For example, two-qubit gates rotate the state of two qubits as a rotation in the four-dimensional Hilbert space of the two qubits. (As is well-known to those having ordinary skill in the art, a Hilbert space is an abstract vector space possessing the structure of an inner product that allows length and angle to be measured. Furthermore, Hilbert spaces are complete: there are enough limits in the space to allow the techniques of calculus to be used.)

A quantum circuit may be specified as a sequence of quantum gates. As described in more detail below, the term "quantum gate," as used herein, refers to the application of a gate control signal (defined below) to one or more qubits to cause those qubits to undergo certain physical transformations and thereby to implement a logical gate operation. To conceptualize a quantum circuit, the matrices corresponding to the component quantum gates may be multiplied together in the order specified by the gate sequence to produce a $2^n \times 2^n$ complex matrix representing the same overall state change on n qubits. A quantum circuit may thus be expressed as a single resultant operator. However, designing a quantum circuit in terms of constituent gates allows the design to conform to a standard set of gates, and thus enable greater ease of deployment. A quantum circuit thus corresponds to a design for actions taken upon the physical components of a quantum computer.

A given variational quantum circuit may be parameterized in a suitable device-specific manner. More generally, the quantum gates making up a quantum circuit may have an associated plurality of tuning parameters. For example, in embodiments based on optical switching, tuning parameters may correspond to the angles of individual optical elements.

In certain embodiments of quantum circuits, the quantum circuit includes both one or more gates and one or more measurement operations. Quantum computers implemented using such quantum circuits are referred to herein as implementing "measurement feedback." For example, a quantum computer implementing measurement feedback may execute the gates in a quantum circuit and then measure only a subset (i.e., fewer than all) of the qubits in the quantum computer, and then decide which gate(s) to execute next based on the outcome(s) of the measurement(s). In particular, the measurement(s) may indicate a degree of error in the gate operation(s), and the quantum computer may decide which gate(s) to execute next based on the degree of error. The quantum computer may then execute the gate(s) indicated by the decision. This process of executing gates, measuring a subset of the qubits, and then deciding which gate(s) to execute next may be repeated any number of times. Measurement feedback may be useful for performing quantum error correction, but is not limited to use in performing quantum error correction. For every quantum circuit, there is an error-corrected implementation of the circuit with or without measurement feedback.

Some embodiments described herein generate, measure, or utilize quantum states that approximate a target quantum state (e.g., a ground state of a Hamiltonian). As will be appreciated by those trained in the art, there are many ways to quantify how well a first quantum state "approximates" a second quantum state. In the following description, any concept or definition of approximation known in the art may be used without departing from the scope hereof. For example, when the first and second quantum states are represented as first and second vectors, respectively, the first quantum state approximates the second quantum state when an inner product between the first and second vectors (called the "fidelity" between the two quantum states) is greater than a predefined amount (typically labeled c). In this example, the fidelity quantifies how "close" or "similar" the first and second quantum states are to each other. The fidelity represents a probability that a measurement of the first quantum state will give the same result as if the measurement were performed on the second quantum state. Proximity between quantum states can also be quantified with a distance measure, such as a Euclidean norm, a Hamming distance, or another type of norm known in the art. Proximity between quantum states can also be defined in computational terms. For example, the first quantum state approximates the second quantum state when a polynomial time-sampling of the first quantum state gives some desired information or property that it shares with the second quantum state.

Not all quantum computers are gate model quantum computers. Embodiments of the present invention are not limited to being implemented using gate model quantum computers. As an alternative example, embodiments of the present invention may be implemented, in whole or in part, using a quantum computer that is implemented using a quantum annealing architecture, which is an alternative to the gate model quantum computing architecture. More specifically, quantum annealing (QA) is a metaheuristic for finding the global minimum of a given objective function over a given set of candidate solutions (candidate states), by a process using quantum fluctuations.

Figure 2A:
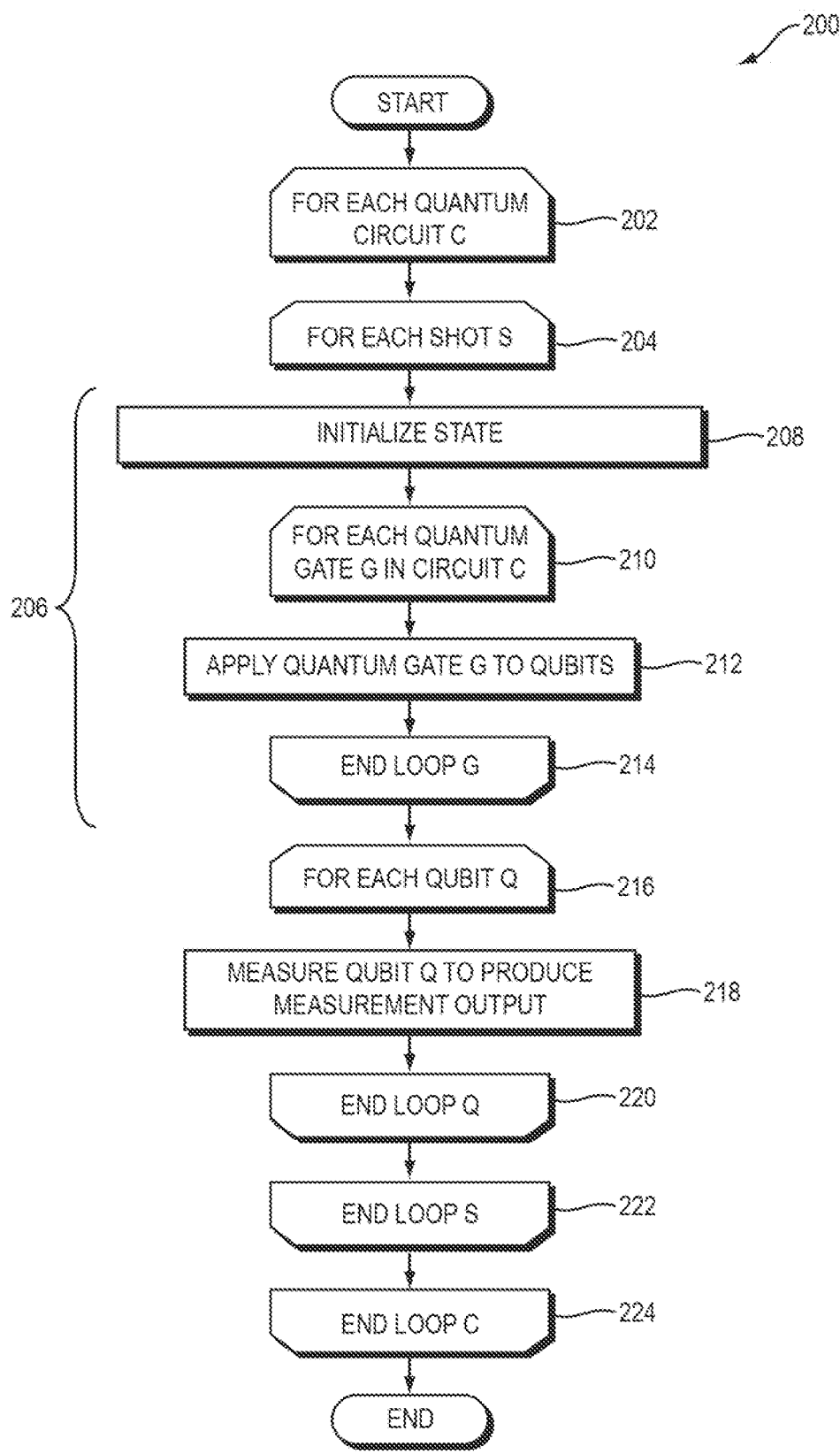
FIG. 2A is a flowchart of a method performed by the quantum computer of FIG. 1 according to one embodiment of the present invention.
Figure 2B:
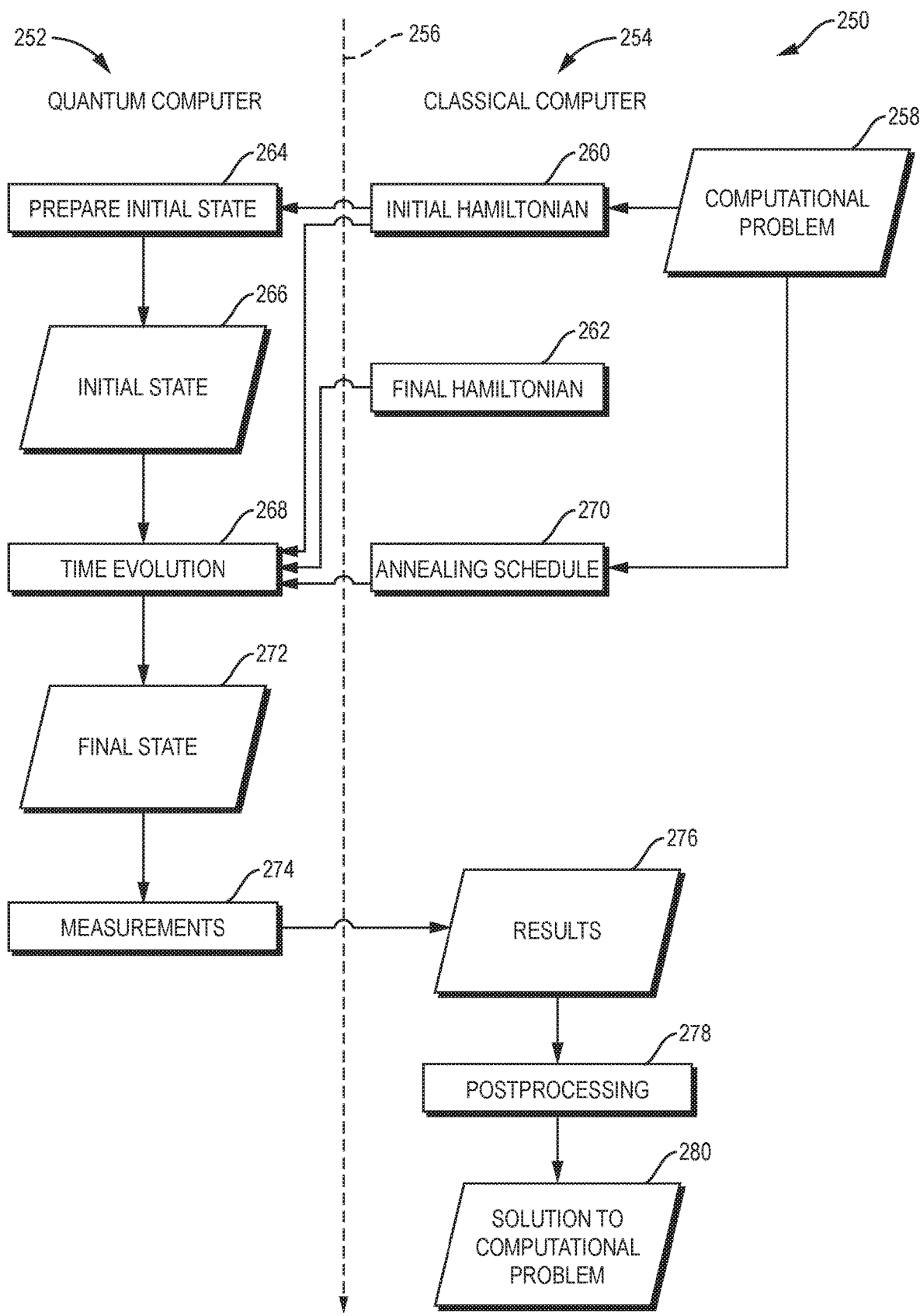
FIG. 2B is a diagram of a hybrid quantum-classical computer which performs quantum annealing according to one embodiment of the present invention.

FIG. 2B shows a diagram illustrating operations typically performed by a computer system 250 which implements quantum annealing. The system 250 includes both a quantum computer 252 and a classical computer 254. Operations shown on the left of the dashed vertical line 256 typically are performed by the quantum computer 252, while operations shown on the right of the dashed vertical line 256 typically are performed by the classical computer 254.

Quantum annealing starts with the classical computer 254 generating an initial Hamiltonian 260 and a final Hamiltonian 262 based on a computational problem 258 to be solved, and providing the initial Hamiltonian 260, the final Hamiltonian 262 and an annealing schedule 270 as input to the quantum computer 252. The quantum computer 252 prepares a well-known initial state 266 (FIG. 2B, operation 264), such as a quantum-mechanical superposition of all possible states (candidate states) with equal weights, based on the initial Hamiltonian 260. The classical computer 254 provides the initial Hamiltonian 260, a final Hamiltonian 262, and an annealing schedule 270 to the quantum computer 252. The quantum computer 252 starts in the initial state 266, and evolves its state according to the annealing schedule 270 following the time-dependent Schrödinger equation, a natural quantum-mechanical evolution of physical systems (FIG. 2B, operation 268). More specifically, the state of the quantum computer 252 undergoes time evolution under a time-dependent Hamiltonian, which starts from the initial Hamiltonian 260 and terminates at the final Hamiltonian 262. If the rate of change of the system Hamiltonian is slow enough, the system stays close to the ground state of the instantaneous Hamiltonian. If the rate of change of the system Hamiltonian is accelerated, the system may leave the ground state temporarily but produce a higher likelihood of concluding in the ground state of the final problem Hamiltonian, i.e., diabatic quantum computation. At the end of the time evolution, the set of qubits on the quantum annealer is in a final state 272, which is expected to be close to the ground state of the classical Ising model that corresponds to the solution to the original computational problem 258. An experimental demonstration of the success of quantum annealing for random magnets was reported immediately after the initial theoretical proposal.

The final state 272 of the quantum computer 252 is measured, thereby producing results 276 (i.e., measurements) (FIG. 2B, operation 274). The measurement operation 274 may be performed, for example, in any of the ways disclosed herein, such as in any of the ways disclosed herein in connection with the measurement unit 110 in FIG. 1. The classical computer 254 performs postprocessing on the measurement results 276 to produce output 280 representing a solution to the original computational problem 258 (FIG. 2B, operation 278).

As yet another alternative example, embodiments of the present invention may be implemented, in whole or in part, using a quantum computer that is implemented using a one-way quantum computing architecture, also referred to as a measurement-based quantum computing architecture, which is another alternative to the gate model quantum computing architecture. More specifically, the one-way or measurement based quantum computer (MBQC) is a method of quantum computing that first prepares an entangled resource state, usually a cluster state or graph state, then performs single qubit measurements on it. It is "one-way" because the resource state is destroyed by the measurements.

The outcome of each individual measurement is random, but they are related in such a way that the computation always succeeds. In general, the choices of basis for later measurements need to depend on the results of earlier measurements, and hence the measurements cannot all be performed at the same time.

Any of the functions disclosed herein may be implemented using means for performing those functions. Such means include, but are not limited to, any of the components disclosed herein, such as the computer-related components described below.

Referring to FIG. 1, a diagram is shown of a system 100 implemented according to one embodiment of the present invention. Referring to FIG. 2A, a flowchart is shown of a method 200 performed by the system 100 of FIG. 1 according to one embodiment of the present invention. The system 100 includes a quantum computer 102. The quantum computer 102 includes a plurality of qubits 104, which may be implemented in any of the ways disclosed herein. There may be any number of qubits 104 in the quantum computer 102. For example, the qubits 104 may include or consist of no more than 2 qubits, no more than 4 qubits, no more than 8 qubits, no more than 16 qubits, no more than 32 qubits, no more than 64 qubits, no more than 128 qubits, no more than 256 qubits, no more than 512 qubits, no more than 1024 qubits, no more than 2048 qubits, no more than 4096 qubits, or no more than 8192 qubits. These are merely examples, in practice there may be any number of qubits 104 in the quantum computer 102.

There may be any number of gates in a quantum circuit. However, in some embodiments the number of gates may be at least proportional to the number of qubits 104 in the quantum computer 102. In some embodiments, the gate depth may be no greater than the number of qubits 104 in the quantum computer 102, or no greater than some linear multiple of the number of qubits 104 in the quantum computer 102 (e.g., 2, 3, 4, 5, 6, or 7).

The qubits 104 may be interconnected in any graph pattern. For example, they be connected in a linear chain, a two-dimensional grid, an all-to-all connection, any combination thereof, or any subgraph of any of the preceding.

As will become clear from the description below, although element 102 is referred to herein as a "quantum computer," this does not imply that all components of the quantum computer 102 leverage quantum phenomena. One or more components of the quantum computer 102 may, for example, be classical (i.e., non-quantum components) components which do not leverage quantum phenomena.

The quantum computer 102 includes a control unit 106, which may include any of a variety of circuitry and/or other machinery for performing the functions disclosed herein. The control unit 106 may, for example, consist entirely of classical components. The control unit 106 generates and provides as output one or more control signals 108 to the qubits 104. The control signals 108 may take any of a variety of forms, such as any kind of electromagnetic signals, such as electrical signals, magnetic signals, optical signals (e.g., laser pulses), or any combination thereof.

For example:

In embodiments in which some or all of the qubits 104 are implemented as photons (also referred to as a "quantum optical" implementation) that travel along waveguides, the control unit 106 may be a beam splitter (e.g., a heater or a mirror), the control signals 108 may be signals that control the heater or the rotation of the mirror, the measurement unit 110 may be a photodetector, and the measurement signals 112 may be photons.

In embodiments in which some or all of the qubits 104 are implemented as charge type qubits (e.g., transmon, X-mon, G-mon) or flux-type qubits (e.g., flux qubits, capacitively shunted flux qubits) (also referred to as a "circuit quantum electrodynamic" (circuit QED) implementation), the control unit 106 may be a bus resonator activated by a drive, the control signals 108 may be cavity modes, the measurement unit 110 may be a second resonator (e.g., a low-Q resonator), and the measurement signals 112 may be voltages measured from the second resonator using dispersive readout techniques.

In embodiments in which some or all of the qubits 104 are implemented as superconducting circuits, the control unit 106 may be a circuit QED-assisted control unit or a direct capacitive coupling control unit or an inductive capacitive coupling control unit, the control signals 108 may be cavity modes, the measurement unit 110 may be a second resonator (e.g., a low-Q resonator), and the measurement signals 112 may be voltages measured from the second resonator using dispersive readout techniques.

In embodiments in which some or all of the qubits 104 are implemented as trapped ions (e.g., electronic states of, e.g., magnesium ions), the control unit 106 may be a laser, the control signals 108 may be laser pulses, the measurement unit 110 may be a laser and either a CCD or a photodetector (e.g., a photomultiplier tube), and the measurement signals 112 may be photons.

In embodiments in which some or all of the qubits 104 are implemented using nuclear magnetic resonance (NMR) (in which case the qubits may be molecules, e.g., in liquid or solid form), the control unit 106 may be a radio frequency (RF) antenna, the control signals 108 may be RF fields emitted by the RF antenna, the measurement unit 110 may be another RF antenna, and the measurement signals 112 may be RF fields measured by the second RF antenna.

In embodiments in which some or all of the qubits 104 are implemented as nitrogen-vacancy centers (NV centers), the control unit 106 may, for example, be a laser, a microwave antenna, or a coil, the control signals 108 may be visible light, a microwave signal, or a constant electromagnetic field, the measurement unit 110 may be a photodetector, and the measurement signals 112 may be photons.

In embodiments in which some or all of the qubits 104 are implemented as two-dimensional quasiparticles called "anyons" (also referred to as a "topological quantum computer" implementation), the control unit 106 may be nanowires, the control signals 108 may be local electrical fields or microwave pulses, the measurement unit 110 may be superconducting circuits, and the measurement signals 112 may be voltages.

In embodiments in which some or all of the qubits 104 are implemented as semiconducting material (e.g., nanowires), the control unit 106 may be microfabricated gates, the control signals 108 may be RF or microwave signals, the measurement unit 110 may be microfabricated gates, and the measurement signals 112 may be RF or microwave signals.

Although not shown explicitly in FIG. 1 and not required, the measurement unit 110 may provide one or more feedback signals 114 to the control unit 106 based on the measurement signals 112. For example, quantum computers referred to as "one-way quantum computers" or "measurement-based quantum computers" utilize such feedback signals 114 from the measurement unit 110 to the control unit 106. Such feedback signals 114 is also necessary for the operation of fault-tolerant quantum computing and error correction.

The control signals 108 may, for example, include one or more state preparation signals which, when received by the qubits 104, cause some or all of the qubits 104 to change their states. Such state preparation signals constitute a quantum circuit also referred to as an "ansatz circuit." The resulting state of the qubits 104 is referred to herein as an "initial state" or an "ansatz state." The process of outputting the state preparation signal(s) to cause the qubits 104 to be in their initial state is referred to herein as "state preparation" (FIG. 2A, section 206). A special case of state preparation is "initialization," also referred to as a "reset operation," in which the initial state is one in which some or all of the qubits 104 are in the "zero" state i.e., the default single-qubit state (FIG. 2, operation 208). More generally, state preparation may involve using the state preparation signals to cause some or all of the qubits 104 to be in any distribution of desired states. In some embodiments, the control unit 106 may first perform initialization on the qubits 104 and then perform preparation on the qubits 104, by first outputting a first set of state preparation signals to initialize the qubits 104, and by then outputting a second set of state preparation signals to put the qubits 104 partially or entirely into non-zero states.

Another example of control signals 108 that may be output by the control unit 106 and received by the qubits 104 are gate control signals. The control unit 106 may output such gate control signals, thereby applying one or more gates to the qubits 104. Applying a gate to one or more qubits causes the set of qubits to undergo a physical state change which embodies a corresponding logical gate operation (e.g., single-qubit rotation, two-qubit entangling gate or multi-qubit operation) specified by the received gate control signal. As this implies, in response to receiving the gate control signals, the qubits 104 undergo physical transformations which cause the qubits 104 to change state in such a way that the states of the qubits 104, when measured (see below), represent the results of performing logical gate operations specified by the gate control signals. The term "quantum gate," as used herein, refers to the application of a gate control signal to one or more qubits to cause those qubits to undergo the physical transformations described above and thereby to implement a logical gate operation.

It should be understood that the dividing line between state preparation (and the corresponding state preparation signals) and the application of gates (and the corresponding gate control signals) may be chosen arbitrarily. For example, some or all the components and operations that are illustrated in FIGS. 1 and 2A-2B as elements of "state preparation" may instead be characterized as elements of gate application. Conversely, for example, some or all of the components and operations that are illustrated in FIGS. 1 and 2A-2B as elements of "gate application" may instead be characterized as elements of state preparation. As one particular example, the system and method of FIGS. 1 and 2A-2B may be characterized as solely performing state preparation followed by measurement, without any gate application, where the elements that are described herein as being part of gate application are instead considered to be part of state preparation. Conversely, for example, the system and method of FIGS. 1 and 2A-2B may be characterized as solely performing gate application followed by measurement, without any state preparation, and where the elements that are described herein as being part of state preparation are instead considered to be part of gate application.

The quantum computer 102 also includes a measurement unit 110, which performs one or more measurement operations on the qubits 104 to read out measurement signals 112 (also referred to herein as "measurement results") from the qubits 104, where the measurement results 112 are signals representing the states of some or all of the qubits 104. In practice, the control unit 106 and the measurement unit 110 may be entirely distinct from each other, or contain some components in common with each other, or be implemented using a single unit (i.e., a single unit may implement both the control unit 106 and the measurement unit 110). For example, a laser unit may be used both to generate the control signals 108 and to provide stimulus (e.g., one or more laser beams) to the qubits 104 to cause the measurement signals 112 to be generated.

In general, the quantum computer 102 may perform various operations described above any number of times. For example, the control unit 106 may generate one or more control signals 108, thereby causing the qubits 104 to perform one or more quantum gate operations. The measurement unit 110 may then perform one or more measurement operations on the qubits 104 to read out a set of one or more measurement signals 112. The measurement unit 110 may repeat such measurement operations on the qubits 104 before the control unit 106 generates additional control signals 108, thereby causing the measurement unit 110 to read out additional measurement signals 112 resulting from the same gate operations that were performed before reading out the previous measurement signals 112. The measurement unit 110 may repeat this process any number of times to generate any number of measurement signals 112 corresponding to the same gate operations. The quantum computer 102 may then aggregate such multiple measurements of the same gate operations in any of a variety of ways.

After the measurement unit 110 has performed one or more measurement operations on the qubits 104 after they have performed one set of gate operations, the control unit 106 may generate one or more additional control signals 108, which may differ from the previous control signals 108, thereby causing the qubits 104 to perform one or more additional quantum gate operations, which may differ from the previous set of quantum gate operations. The process described above may then be repeated, with the measurement unit 110 performing one or more measurement operations on the qubits 104 in their new states (resulting from the most recently-performed gate operations).

In general, the system 100 may implement a plurality of quantum circuits as follows. For each quantum circuit C in the plurality of quantum circuits (FIG. 2A, operation 202), the system 100 performs a plurality of "shots" on the qubits 104. The meaning of a shot will become clear from the description that follows. For each shot S in the plurality of shots (FIG. 2A, operation 204), the system 100 prepares the state of the qubits 104 (FIG. 2A, section 206). More specifically, for each quantum gate G in quantum circuit C (FIG. 2A, operation 210), the system 100 applies quantum gate G to the qubits 104 (FIG. 2A, operations 212 and 214).

Then, for each of the qubits Q 104 (FIG. 2A, operation 216), the system 100 measures the qubit Q to produce measurement output representing a current state of qubit Q (FIG. 2A, operations 218 and 220).

The operations described above are repeated for each shot S (FIG. 2A, operation 222), and circuit C (FIG. 2A, operation 224). As the description above implies, a single "shot" involves preparing the state of the qubits 104 and applying all of the quantum gates in a circuit to the qubits 104 and then measuring the states of the qubits 104; and the system 100 may perform multiple shots for one or more circuits.

Referring to FIG. 3, a diagram is shown of a hybrid quantum-classical (HQC) computer 300 implemented according to one embodiment of the present invention. The HQC 300 includes a quantum computer component 102 (which may, for example, be implemented in the manner shown and described in connection with FIG. 1) and a classical computer component 306. The classical computer component may be a machine implemented according to the general computing model established by John Von Neumann, in which programs are written in the form of ordered lists of instructions and stored within a classical (e.g., digital) memory 310 and executed by a classical (e.g., digital) processor 308 of the classical computer. The memory 310 is classical in the sense that it stores data in a storage medium in the form of bits, which have a single definite binary state at any point in time. The bits stored in the memory 310 may, for example, represent a computer program. The classical computer component 304 typically includes a bus 314. The processor 308 may read bits from and write bits to the memory 310 over the bus 314. For example, the processor 308 may read instructions from the computer program in the memory 310, and may optionally receive input data 316 from a source external to the computer 302, such as from a user input device such as a mouse, keyboard, or any other input device. The processor 308 may use instructions that have been read from the memory 310 to perform computations on data read from the memory 310 and/or the input 316, and generate output from those instructions. The processor 308 may store that output back into the memory 310 and/or provide the output externally as output data 318 via an output device, such as a monitor, speaker, or network device.

The quantum computer component 102 may include a plurality of qubits 104, as described above in connection with FIG. 1. A single qubit may represent a one, a zero, or any quantum superposition of those two qubit states. The classical computer component 304 may provide classical state preparation signals 332 to the quantum computer 102, in response to which the quantum computer 102 may prepare the states of the qubits 104 in any of the ways disclosed herein, such as in any of the ways disclosed in connection with FIGS. 1 and 2A-2B.

Once the qubits 104 have been prepared, the classical processor 308 may provide classical control signals 334 to the quantum computer 102, in response to which the quantum computer 102 may apply the gate operations specified by the control signals 334 to the qubits 104, as a result of which the qubits 104 arrive at a final state. The measurement unit 110 in the quantum computer 102 (which may be implemented as described above in connection with FIGS. 1 and 2A-2B) may measure the states of the qubits 104 and produce measurement output 338 representing the collapse of the states of the qubits 104 into one of their eigenstates. As a result, the measurement output 338 includes or consists of bits and therefore represents a classical state. The quantum computer 102 provides the measurement output 338 to the classical processor 308. The classical processor 308 may store data representing the measurement output 338 and/or data derived therefrom in the classical memory 310.

The steps described above may be repeated any number of times, with what is described above as the final state of the qubits 104 serving as the initial state of the next iteration. In this way, the classical computer 304 and the quantum computer 102 may cooperate as co-processors to perform joint computations as a single computer system.

Although certain functions may be described herein as being performed by a classical computer and other functions may be described herein as being performed by a quantum computer, these are merely examples and do not constitute limitations of the present invention. A subset of the functions which are disclosed herein as being performed by a quantum computer may instead be performed by a classical computer. For example, a classical computer may execute functionality for emulating a quantum computer and provide a subset of the functionality described herein, albeit with functionality limited by the exponential scaling of the simulation. Functions which are disclosed herein as being performed by a classical computer may instead be performed by a quantum computer.

The techniques described above may be implemented, for example, in hardware, in one or more computer programs tangibly stored on one or more computer-readable media, firmware, or any combination thereof, such as solely on a quantum computer, solely on a classical computer, or on a hybrid quantum-classical (HQC) computer. The techniques disclosed herein may, for example, be implemented solely on a classical computer, in which the classical computer emulates the quantum computer functions disclosed herein.

The techniques described above may be implemented in one or more computer programs executing on (or executable by) a programmable computer (such as a classical computer, a quantum computer, or an HQC) including any combination of any number of the following: a processor, a storage medium readable and/or writable by the processor (including, for example, volatile and non-volatile memory and/or storage elements), an input device, and an output device. Program code may be applied to input entered using the input device to perform the functions described and to generate output using the output device.

Embodiments of the present invention include features which are only possible and/or feasible to implement with the use of one or more computers, computer processors, and/or other elements of a computer system. Such features are either impossible or impractical to implement mentally and/or manually. For example, for a problem involving finding an n-bit string which satisfies a given condition, the search space is of size $2^n$, which quickly goes beyond what is possible manually or mentally for moderate values of n (for example n=10).

Any claims herein which affirmatively require a computer, a processor, a memory, or similar computer-related elements, are intended to require such elements, and should not be interpreted as if such elements are not present in or required by such claims. Such claims are not intended, and should not be interpreted, to cover methods and/or systems which lack the recited computer-related elements. For example, any method claim herein which recites that the claimed method is performed by a computer, a processor, a memory, and/or similar computer-related element, is intended to, and should only be interpreted to, encompass methods which are performed by the recited computer-related element(s). Such a method claim should not be interpreted, for example, to encompass a method that is performed mentally or by hand (e.g., using pencil and paper). Similarly, any product claim herein which recites that the claimed product includes a computer, a processor, a memory, and/or similar computer-related element, is intended to, and should only be interpreted to, encompass products which include the recited computer-related element(s). Such a product claim should not be interpreted, for example, to encompass a product that does not include the recited computer-related element(s).

In embodiments in which a classical computing component executes a computer program providing any subset of the functionality within the scope of the claims below, the computer program may be implemented in any programming language, such as assembly language, machine language, a high-level procedural programming language, or an object-oriented programming language. The programming language may, for example, be a compiled or interpreted programming language.

Each such computer program may be implemented in a computer program product tangibly embodied in a machine-readable storage device for execution by a computer processor, which may be either a classical processor or a quantum processor. Method steps of the invention may be performed by one or more computer processors executing a program tangibly embodied on a computer-readable medium to perform functions of the invention by operating on input and generating output. Suitable processors include, by way of example, both general and special purpose microprocessors. Generally, the processor receives (reads) instructions and data from a memory (such as a read-only memory and/or a random-access memory) and writes (stores) instructions and data to the memory. Storage devices suitable for tangibly embodying computer program instructions and data include, for example, all forms of non-volatile memory, such as semiconductor memory devices, including EPROM, EEPROM, and flash memory devices; magnetic disks such as internal hard disks and removable disks; magneto-optical disks; and CD-ROMs. Any of the foregoing may be supplemented by, or incorporated in, specially-designed ASICs (application-specific integrated circuits) or FPGAs (Field-Programmable Gate Arrays). A classical computer can generally also receive (read) programs and data from, and write (store) programs and data to, a non-transitory computer-readable storage medium such as an internal disk (not shown) or a removable disk. These elements will also be found in a conventional desktop or workstation computer as well as other computers suitable for executing computer programs implementing the methods described herein, which may be used in conjunction with any digital print engine or marking engine, display monitor, or other raster output device capable of producing color or gray scale pixels on paper, film, display screen, or other output medium.

Any data disclosed herein may be implemented, for example, in one or more data structures tangibly stored on a non-transitory computer-readable medium (such as a classical computer-readable medium, a quantum computer-readable medium, or an HQC computer-readable medium). Embodiments of the invention may store such data in such data structure(s) and read such data from such data structure(s).

What is claimed is:

1. A method for use with:
   a Boolean function which maps at least one input bit to at least one output bit;
   a seed output value satisfying at least one condition; and
   a set of constraints, comprising S unknown bits, such that a satisfying assignment of the constraints corresponds to a specific input value being mapped by the Boolean function to the seed output value;
   the method comprising:
   (A) using a hybrid quantum-classical computer, the hybrid quantum-classical computer comprising (i) a classical computer, and (ii) a quantum computer with a plurality of N qubits, to find a satisfying assignment of the constraints, comprising:
   (A) (1) generating a set of solution candidates, the generating comprising:
   (A) (1) (i) at the classical computer, assigning a set of M trial bits, where S−M≤N is a desired number of qubits;
   (A) (1) (ii) reducing the set of constraints to a reduced set of constraints comprising S−M unknown bits;
   (A) (1) (iii) translating the reduced set of constraints into interactions between quantum spins;
   (A) (1) (iv) forming, from the interactions, an Ising Hamiltonian whose ground state encodes a set of states of the specific input value that are consistent with the reduced set of constraints;
   (A) (1) (v) performing a quantum optimization algorithm on a quantum computing component of the hybrid quantum-classical computer to generate an approximation to the ground state of the Ising Hamiltonian; and (A) (1) (vi) measuring the approximation to the ground state of the Ising Hamiltonian, on the quantum computing component, to obtain a plurality of trial strings;
(A) (1) (vii) at the classical computer, combining the set of M trial bits with the plurality of trial strings to obtain a set of solution candidates;
(A) (2) checking the set of solution candidates for a satisfying assignment;
(A) (2) (a) if the satisfying assignment is found, then outputting the satisfying assignment;
(A) (2) (b) if the satisfying assignment is not found, generating an updated set of solution candidates by repeating (A) (1) with an updated set of K trial bits, where S–K<N, thereby replacing the M trial bits; and
(A) (3) repeating (A) (2) until a satisfying assignment is found.

2. The method of claim 1, wherein the at least one condition is satisfied by a specific value, and wherein the seed output value is the specific value.

3. The method of claim 1, further comprising:
(B) before (A), generating the set of constraints using a classical computer.

4. The method of claim 3, wherein (B) comprises:
(B) (1) receiving as input a description of a classical logical circuit, the classical logical circuit mapping the at least one input bit to the at least one output bit; and
(B) (2) computing a description of the set of constraints as a function of an intermediate state of the classical logical circuit based on a sequence of elementary gate operations in the classical logical circuit.

5. The method of claim 4, wherein the classical logical circuit implements at least one elementary gate operation selected from the set consisting of AND, NOT, OR, and XOR operations.

6. The method of claim 3 or claim 4, wherein (B) comprises simplifying the set of constraints by performing a preprocessing step on the classical computing component.

7. The method of claim 1, wherein (A) (6) is performed by the quantum computing component of the hybrid quantum-classical computer.

8. The method of claim 1 or claim 7, wherein (A) (4) is performed by a classical computing component of the hybrid quantum-classical computer.

9. The method of claim 1, wherein reducing the set of constraints comprises using a candidate solution to satisfy constraints in the set of constraints.

10. A hybrid quantum-classical computing system for use with:
a Boolean function which maps at least one input bit to at least one output bit;
a seed output value satisfying at least one condition; and
a set of constraints, comprising S unknown bits, such that a satisfying assignment of the constraints corresponds to a specific input value being mapped by the Boolean function to the seed output value;
the hybrid quantum-classical computing system comprising:
a quantum computing component having a plurality of N qubits and a qubit controller that manipulates the plurality of N qubits; and
a classical computing component storing machine-readable instructions that, when executed by the classical computer, control the classical computer to cooperate with the quantum computer to:
generate a set of solution candidates, the generating comprising:
at the classical computer, assign a set of M trial bits, where S–M<N is a desired number of qubits;
reduce the set of constraints to a reduced set of constraints comprising S–M unknown bits;
translate the reduced set of constraints into interactions between quantum spins;
form, from the interactions, an Ising Hamiltonian whose ground state encodes a set of states of the specific input value that are consistent with the reduced set of constraints;
perform, on the quantum computing component, a quantum optimization algorithm to generate an approximation to the ground state of the Ising Hamiltonian; and
measure the approximation to the ground state of the Ising Hamiltonian, on the quantum computing component, to obtain a plurality of trial strings;
at the classical computer, combine the set of M trial bits with the plurality of trial strings to obtain a set of solution candidates;
check the set of solution candidates for a satisfying assignment;
if the satisfying assignment is found, then outputting the satisfying assignment;
if the satisfying assignment is not found, generating an updated set of solution candidates by repeating the generating with an updated set of K trial bits, where S–K<N, thereby replacing the M trial bits; and
repeat checking the set of solution candidates for a satisfying assignment until a satisfying assignment is found.

11. The hybrid quantum-classical computing system of claim 10, wherein the at least one condition is satisfied by a specific value, and wherein the seed output value is the specific value.

12. The hybrid quantum-classical computing system of claim 10, wherein the machine-readable instructions further comprise instructions to control the classical computing component to generate the set of constraints.

13. The hybrid quantum-classical computing system of claim 12, wherein controlling the classical computing component to generate the set of constraints comprises controlling the classical computing component to:
receive as input a description of a classical logical circuit, the classical logical circuit mapping the at least one input bit to the at least one output bit; and
compute a description of the set of constraints as a function of an intermediate state of the classical logical circuit based on a sequence of elementary gate operations in the classical logical circuit.

14. The hybrid quantum-classical computing system of claim 13, wherein the classical logical circuit implements at least one elementary gate operation selected from the set consisting of AND, NOT, OR, and XOR operations.

15. The hybrid quantum-classical computing system of claim 12 or claim 13, wherein controlling the classical computing component to generate the set of constraints comprises simplifying the set of constraints by performing a preprocessing step on the classical computing component.

16. The hybrid quantum-classical computing system of claim 10, wherein measuring the approximation to the ground state of the Ising Hamiltonian is performed by the quantum computing component of the hybrid quantum-classical computer.

17. The hybrid quantum-classical computing system of claim 10 or claim 16, wherein forming the Ising Hamiltonian is performed by the classical computing component of the hybrid quantum-classical computer.

18. The hybrid quantum-classical computing system of claim 10, wherein reducing the set of constraints comprises using a candidate solution to satisfy constraints in the set of constraints.

* * * * *